United States Patent
Sun et al.

(10) Patent No.: US 12,051,620 B2
(45) Date of Patent: *Jul. 30, 2024

(54) SEMICONDUCTOR STRUCTURE AND METHOD FOR MANUFACTURING THE SAME

(71) Applicant: TAIWAN SEMICONDUCTOR MANUFACTURING CO., LTD., Hsinchu (TW)

(72) Inventors: Hung-Chang Sun, Kaohsiung (TW); Po-Chin Chang, Taichung (TW); Akira Mineji, Hsinchu County (TW); Zi-Wei Fang, Hsinchu County (TW); Pinyen Lin, Rochester, NY (US)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 101 days.

This patent is subject to a terminal disclaimer.

(21) Appl. No.: 17/845,891

(22) Filed: Jun. 21, 2022

(65) Prior Publication Data

US 2022/0319917 A1    Oct. 6, 2022

Related U.S. Application Data

(60) Continuation of application No. 16/888,929, filed on Jun. 1, 2020, now Pat. No. 11,373,902, which is a
(Continued)

(51) Int. Cl.
| | |
|---|---|
| H01L 21/768 | (2006.01) |
| H01L 21/8234 | (2006.01) |
| H01L 23/532 | (2006.01) |
| H01L 23/535 | (2006.01) |
| H01L 27/088 | (2006.01) |

(52) U.S. Cl.
CPC .. *H01L 21/76837* (2013.01); *H01L 21/76804* (2013.01); *H01L 21/76805* (2013.01); *H01L 21/76816* (2013.01); *H01L 21/76825* (2013.01); *H01L 21/76829* (2013.01); *H01L 21/76895* (2013.01); *H01L 21/823437* (2013.01);
(Continued)

(58) Field of Classification Search
CPC ......... H01L 21/76837; H01L 21/76804; H01L 21/76805; H01L 21/76816; H01L 21/76825; H01L 21/76829; H01L 21/76895; H01L 21/823437;
(Continued)

(56) References Cited

U.S. PATENT DOCUMENTS 5,746,884 A * 5/1998 Gupta ................. H01L 23/5226
257/E23.145
6,001,414 A    12/1999 Huang et al.
(Continued)

*Primary Examiner* — Herve-Louis Y Assouman
(74) *Attorney, Agent, or Firm* — Maschoff Brennan

(57) ABSTRACT

A method for forming a semiconductor structure includes forming a gate structure on a substrate; depositing a first dielectric layer over the gate structure; depositing a second dielectric layer over the first dielectric layer and having a different density than the first dielectric layer; performing a first etching process on the first and second dielectric layers to form a trench; performing a second etching process on the first and second dielectric layers to modify the trench; filling a conductive material in the modified trench.

20 Claims, 31 Drawing Sheets

Related U.S. Application Data division of application No. 15/860,565, filed on Jan. 2, 2018, now Pat. No. 10,692,760.

(60) Provisional application No. 62/592,890, filed on Nov. 30, 2017.

(52) U.S. Cl.
CPC ............... H01L 21/823475 (2013.01); H01L 23/53295 (2013.01); H01L 23/535 (2013.01); H01L 27/088 (2013.01)

(58) Field of Classification Search
CPC ....... H01L 21/823475; H01L 23/53295; H01L 23/535; H01L 27/088
See application file for complete search history.

(56) References Cited

U.S. PATENT DOCUMENTS

| | | |
|---|---|---|
| 6,355,567 B1 | 3/2002 | Halle et al. |
| 6,407,002 B1 | 6/2002 | Lin et al. |
| 6,660,630 B1 | 12/2003 | Chang et al. |
| 10,692,760 B2 * | 6/2020 | Sun .................. H01L 21/76895 |
| 2003/0132526 A1 | 7/2003 | Jeon et al. |
| 2005/0221568 A1 | 10/2005 | Ishida et al. |
| 2006/0065913 A1 | 3/2006 | Sakuma et al. |
| 2008/0224157 A1 | 9/2008 | Slater |
| 2012/0161327 A1 | 6/2012 | Chumakov et al. |
| 2016/0049394 A1 * | 2/2016 | Shin .................. H01L 21/76804 257/288 |
| 2016/0315045 A1 * | 10/2016 | Baek ................. H01L 21/76843 |

* cited by examiner

SEMICONDUCTOR STRUCTURE AND METHOD FOR MANUFACTURING THE SAME

PRIORITY CLAIM AND CROSS-REFERENCE

The present application is a continuation application of U.S. application Ser. No. 16/888,929, filed Jun. 1, 2020, now U.S. Pat. No. 11,373,902, issued Jun. 28, 2022, which is a divisional application of U.S. application Ser. No. 15/860,565, filed Jan. 2, 2018, now U.S. Pat. No. 10,692,760, issued Jun. 23, 2020, which claims priority of U.S. Provisional Application Ser. No. 62/592,890, filed Nov. 30, 2017, all of which are herein incorporated by reference in their entireties.

BACKGROUND

Manufacturing of an integrated circuit (IC) has been driven by increasing the density of the IC formed in a semiconductor device. This is accomplished by implementing more aggressive design rules to allow a larger density of the IC device to be formed. Nonetheless, the increased density of IC devices, such as transistors, has also increased the complexity of processing semiconductor devices with decreased feature sizes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
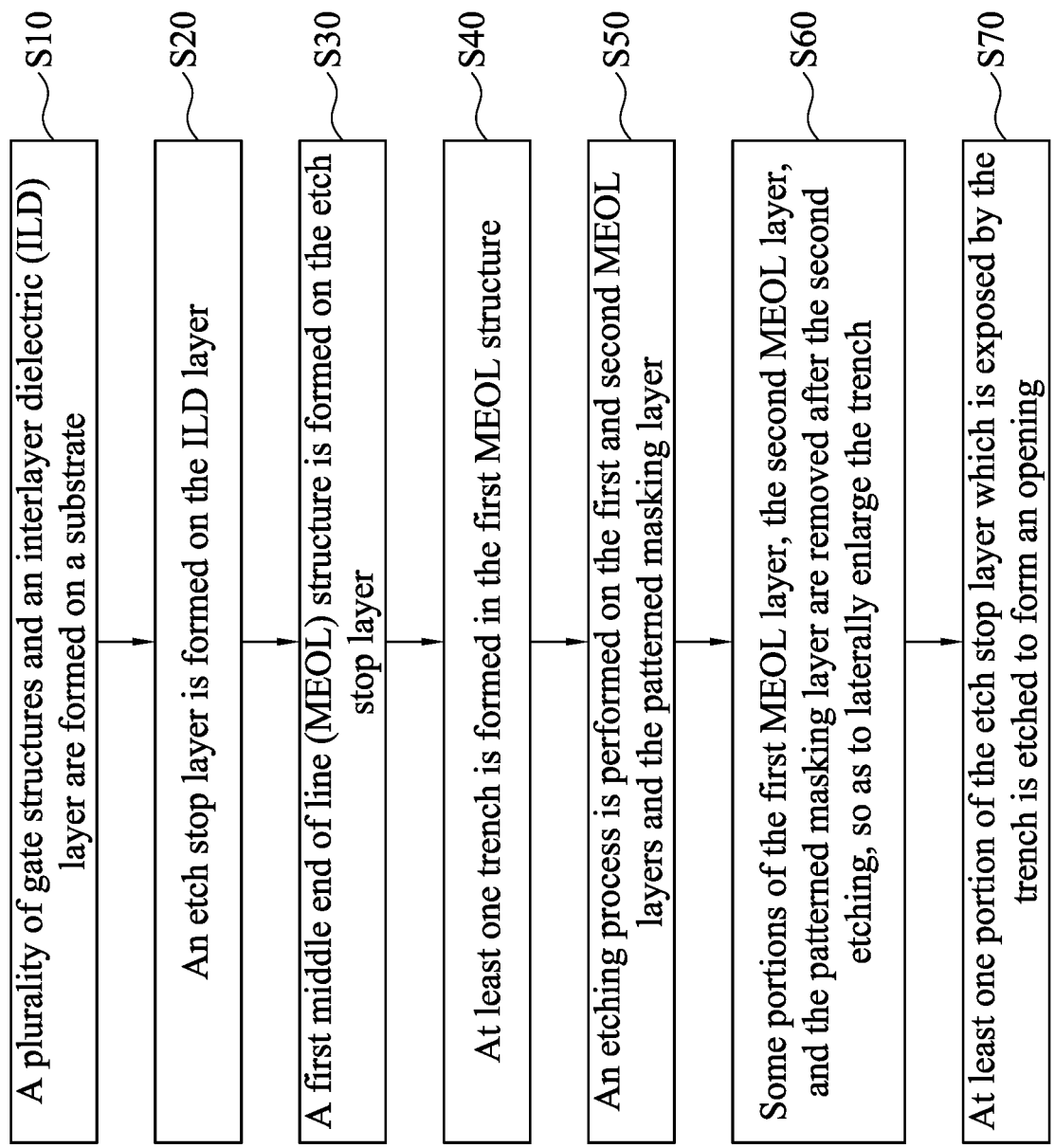
FIG. 1 is a flowchart of operations of a method for manufacturing a semiconductor structure in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," or "includes" and/or "including" or "has" and/or "having" when used in this specification, specify the presence of stated features, regions, integers, operations, elements, and/or components, but do not preclude the presence or addition of one or more other features, regions, integers, operations, elements, components, and/or groups thereof.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

FIG. 1 is a flowchart of operations S10-S70 of a method for manufacturing a semiconductor structure in accordance with some embodiments of the present disclosure. The method begins with operation S10 in which a plurality of gate structures and an interlayer dielectric (ILD) layer are formed on a substrate. The method continues with operation S20 in which an etch stop layer is formed on the ILD layer. The method continues with operation S30 in which a first middle end of line (MEOL) structure is formed on the etch stop layer. The method continues with operation S40 in which at least one trench is formed in the first MEOL structure. The method continues with operation S50 in which an etching process is performed on the first and second MEOL layers and the patterned masking layer. The method continues with operation S60 in which some portions of the first MEOL layer, the second MEOL layer, and the patterned masking layer are removed after the second etching, so as to laterally enlarge the trench. The method continues with operation S70 in which at least one portion of the etch stop layer which is exposed by the trench is etched to form an opening.

FIGS. 2-8 are cross-sectional views of the method for manufacturing a semiconductor structure in accordance with some embodiments of the present disclosure. The operations S10, S20, S30, S40, S50, S60, and S70 mentioned above can performed as FIGS. 2-8, respectively.

Figure 2:
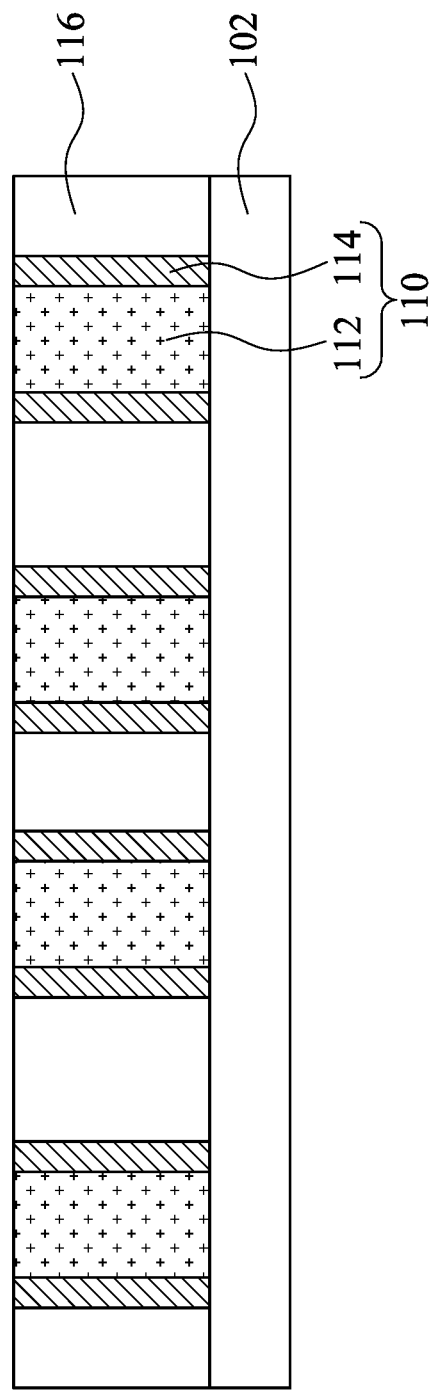
FIGS. 2-8 are cross-sectional views of the method for manufacturing a semiconductor structure in accordance with some embodiments of the present disclosure.

Reference is made to FIG. 2. A plurality of gate structures 110 and an ILD layer 116 are formed on a substrate 102. In some embodiments, the substrate 102 includes a silicon substrate. In some embodiments, the substrate 102 is made of some other suitable elemental semiconductor, such as diamond or germanium (Ge); a suitable compound semiconductor, such as gallium arsenide (GaAs), silicon carbide (SiC), indium arsenide (InAs), or indium phosphide (InP); or a suitable alloy semiconductor, such as silicon germanium carbide (SiGeC), gallium arsenic phosphide (GaAsP), or gallium indium phosphide (GaInP). In some embodiments, the substrate 102 further includes other features such as various doped regions, a buried layer, and/or an epitaxy layer. Furthermore, in some embodiments, the substrate 102 may be a semiconductor on insulator such as silicon on insulator (SOI) or silicon on sapphire. In some embodiments, the substrate 102 includes a doped epi layer, a gradient semiconductor layer, and/or may further include a semiconductor layer overlying another semiconductor layer of a different type such as a silicon layer on a silicon germanium (SiGe) layer. In some embodiments, the substrate 102 includes a multilayer silicon structure or a multilayer compound semiconductor structure.

At least one of the gate structures 110 includes a gate electrode layer 112 and a pair of spacers 114, in which the gate electrode layer 112 and the spacers 114 is formed over the substrate 102 and the spacers 114 are formed to be adjacent to sidewalls of the gate electrode layer 112. In some embodiments, the gate electrode layer 112 includes a single layer or multilayer structure. In some embodiments, the gate electrode layer 112 includes poly-silicon. Furthermore, the gate electrode layer 112 may be doped poly-silicon with the uniform or gradient doping. In some embodiments, the gate electrode layer 112 is formed by using a low-pressure chemical vapor deposition (LPCVD) process. In some other embodiments, the gate electrode layer 112 is a metal gate. In some embodiments, the spacers 114 are formed of silicon oxide, silicon nitride, silicon oxynitride, silicon carbide, fluoride-doped silicate glass (FSG), a low k dielectric material, and/or combinations thereof. In some embodiments, at least one of the spacers 114 may have a multiple-layers structure, for example, including one or more liner layers.

In some embodiments, lightly doped source and drain (LDD) regions and source/drain (S/D) regions are created in the substrate 102. In some embodiments, the LDD regions in the substrate 102 are covered with the spacers 114, and the S/D regions in the substrate 102 are laterally spaced from sides of at least one of the gate structures 110 (i.e. adjacent the regions of the substrate 102 underlying the gate structures 110). In some embodiments, the S/D regions are formed by using an ion implantation. For example, an n-type dopant, such as phosphorous, or a p-type dopant, such as boron is doped into at least one portion of the substrate 102 which is not covered by the gate structures 110, so as to form the S/D regions.

The ILD layer 116 is made of a dielectric material, such as silicon oxide ($Si_xO_y$), silicon nitride ($Si_xN_y$), silicon oxynitride ($Si_xO_yN_z$), or combinations thereof. In some embodiments, the ILD layer 116 is made of a low-k dielectric material to improve resistive-capacitive (RC) delay. The dielectric constant of the low-k dielectric material is lower than that of silicon dioxide ($SiO_2$). One approach to reduce the dielectric constant of a dielectric material is to introduce carbon (C) or fluorine (F) atoms. For example, in $SiO_2$ (k=3.9), the introduction of C atoms to form hydrogenated carbon-doped silicon oxide (SiCOH) (k is between 2.7 and 3.3) and the introduction of F atoms to form fluorosilicate glass (FSG) (k is between 3.5 and 3.9) reduces its dielectric constant. Another approach to reduce the dielectric constant of a dielectric material is by introducing an air gap or pores. Since the dielectric constant of air is 1, the dielectric constant of a dielectric film can be reduced by increasing the porosity of the dielectric film. In some embodiments, the low-k dielectric material is, for example, porous silicon oxide (i.e. the xerogel or the aerogel), nanopore carbon doped oxide (CDO), black diamond (BD), a benzocyclobutene (BCB) based polymer, an aromatic (hydrocarbon) thermosetting polymer (ATP), hydrogen silsesquioxane (HSQ), methyl silsesquioxane (MSQ), poly-arylene ethers (PAE), diamond-like carbon (DLC) doped with nitrogen, or combinations thereof. The ILD layer 116 is formed by, for example, chemical vapor deposition (CVD), spin coating, or combinations thereof.

In some embodiments, at least one dummy gate stack of the gate structures 110 is formed prior to the formation of the ILD layer 116, and the gate electrode layer 112 is formed after the formation of the ILD layer 116. In some embodiments, the dummy gate stack may include a dielectric material, a polysilicon material, or a combination thereof. The dummy gate stack may be formed by any suitable process or processes, such as deposition, patterning and etching. In some embodiments, the ILD layer 116 is formed over the dummy gate stack, and a planarization process, such as a chemical mechanical polishing (CMP) process, is performed on the ILD layer 116 until reaching the dummy gate stack. Then, the dummy gate stack is removed to form a plurality of gate trenches. After the gate trenches are formed, a metal layer may be formed within the gate trenches and on the ILD layer 116, and a CMP process may be performed to remove the excessive metal layer to form the gate electrode layer 112. In some embodiments, the formation of the gate structures 110 can be omitted.

Figure 3:
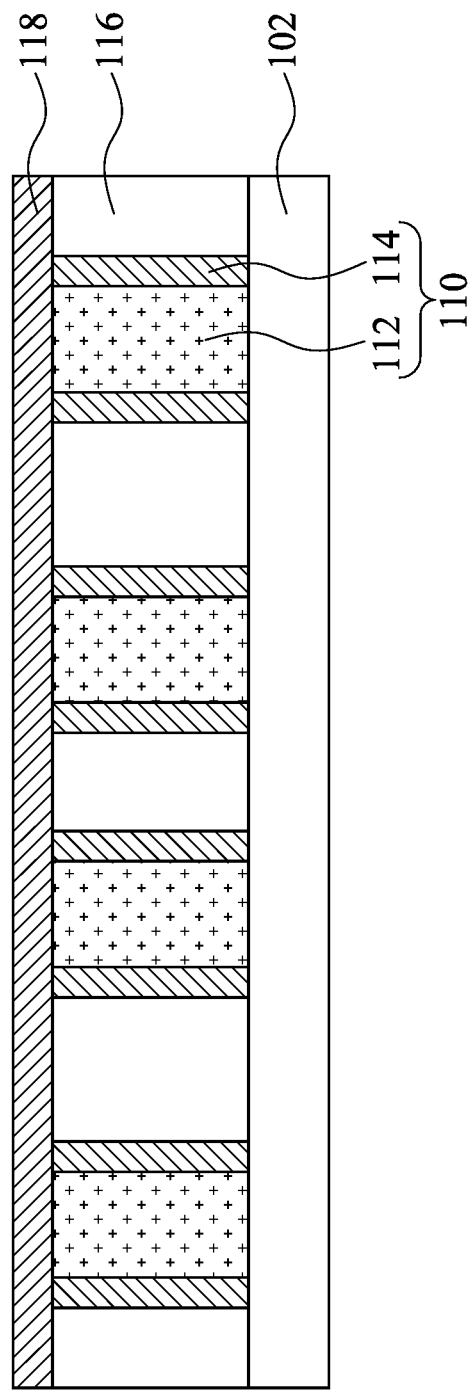

Reference is made to FIG. 3. An etch stop layer 118 is formed on the ILD layer 116. In some embodiments, the etch stop layer 118 is made of titanium nitride (TiN), tungsten carbide (WC), silicon (Si), silicon germanium (SiGe), silicon nitride (SiN), or combinations thereof. In some embodiments, the etch stop layer 118 is formed by, for example, physical vapor deposition (PVD), ionized physical vapor deposition (IPVD), atomic layer deposition (ALD), CVD, or combinations thereof.

Figure 4:
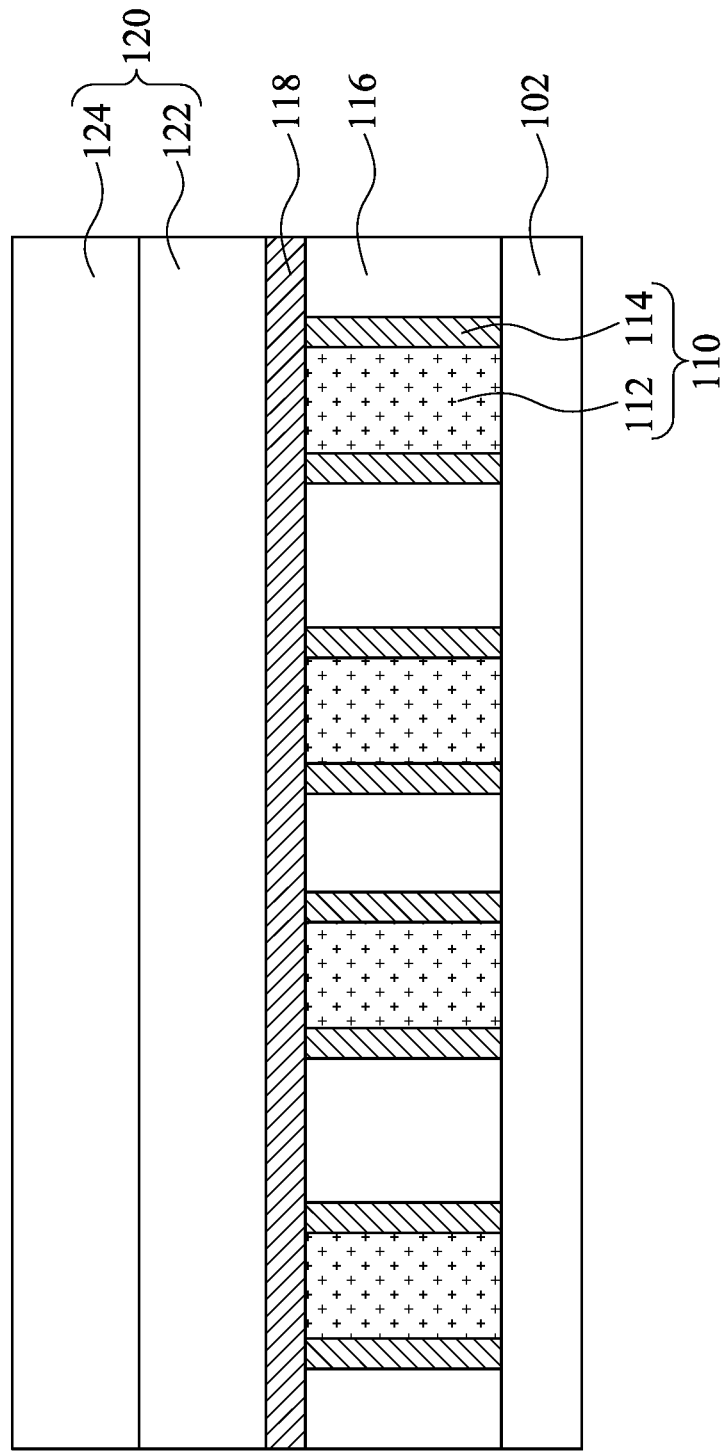

Reference is made to FIG. 4. A first MEOL structure 120 is formed on the etch stop layer 118. In some embodiments, the formation of the first MEOL structure 120 can be referred to as a part of a MEOL process. The MEOL process may include formation of interconnections, such as one or more vias and/or one or more contacts, which are electrically connected with semiconductor devices, such as the gate structures 110. In some embodiments, the processes performed in prior to the MEOL process can be referred to as a front-end-of-line (FEOL) process. Furthermore, a back end of line (BEOL) process may be performed after the MEOL process.

The first MEOL structure 120 includes a first MEOL layer 122 and a second MEOL layer 124. The first MEOL layer 122 is formed above the etch stop layer 118, and the second MEOL layer 124 is formed above the first MEOL layer 122.

In some embodiments, the first MEOL layer 122 is made of silicon nitride (SiN), silicon oxycarbide (SiOC), silicon oxycarbonitride (SiOCN), silicon carbonitride (SiCN), silicon (Si), silicon germanium (SiGe), oxide, tungsten (W), titanium nitride (TiN), hafnium dioxide ($HfO_2$), zirconium dioxide ($ZrO_2$), lanthanum oxide ($La_2O_3$), or combinations thereof. In some embodiments, the first MEOL layer 122 is formed by, for example, PVD, IPVD, ALD, CVD, or combinations thereof. In some embodiments, the first MEOL layer 122 has a thickness in a range from about 10 nm to about 100 nm.

In some embodiments, the second MEOL layer 124 is made of silicon nitride (SiN), silicon oxycarbide (SiOC), silicon oxycarbonitride (SiOCN), silicon carbonitride (SiCN), silicon (Si), silicon germanium (SiGe), oxide, tungsten (W), titanium nitride (TiN), hafnium dioxide ($HfO_2$), zirconium dioxide ($ZrO_2$), lanthanum oxide ($La_2O_3$), or combinations thereof. In some embodiments, the second MEOL layer 124 is formed by, for example, PVD, IPVD, ALD, CVD, or combinations thereof. In some embodiments, the number of the MEOL layers of the first MEOL structure 120 can be varied to increase or decrease. In some embodiments, the second MEOL layer 124 has a thickness in a range from about 10 nm to about 100 nm.

Figure 5:
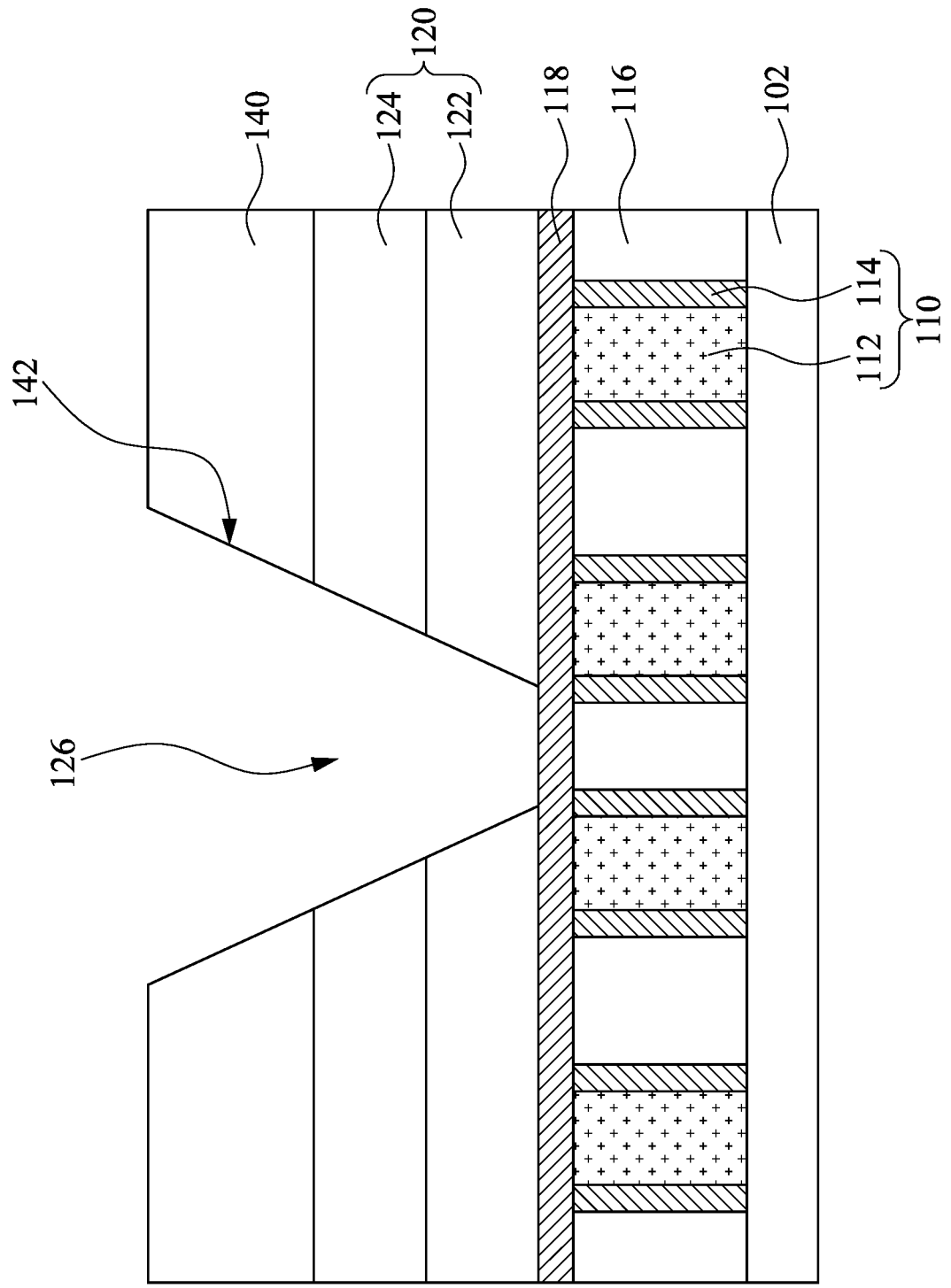

Reference is made to FIG. 5. At least one trench 126 is formed in the first MEOL structure 120. In some embodiments, the trench 126 is formed by removing some portions of the first and second MEOL layers 122 and 124. For example, the portions of the first and second MEOL layers 122 and 124 can be removed by using a photolithography and etching process. The photolithography and etching process includes photoresist application, exposure, developing, etching, and photoresist removal. For example, a patterned masking layer 140 can be applied onto the second MEOL layer 124 by spin coating a photoresist layer onto the second MEOL layer 124. Furthermore, in some embodiments, the patterned masking layer 140 includes a photoresist layer, a bottom anti-reflective coating (BARC) layer, amorphous carbon-hydrogen (a-C:H) layers, or combinations thereof. In some embodiments, the patterned masking layer 140 has a thickness in a range from about 10 nm to about 100 nm.

After the spin coating, the patterned masking layer 140 is then prebaked to drive off excess photoresist solvent. After prebaking, the patterned masking layer 140 is exposed to a pattern of intense light. The intense light is, for example, a G-line with a wavelength of about 436 nm, an I-line with a wavelength of about 365 nm, a krypton fluoride (KrF) excimer laser with a wavelength of about 248 nm, an argon fluoride (ArF) excimer laser with a wavelength of about 193 nm, a fluoride ($F_2$) excimer laser with a wavelength of about 157 nm, or combinations thereof. A space between the final lens of the exposure tool and a surface of the patterned masking layer 140 may be filled with a liquid medium that has a refractive index greater than one during the exposure to enhance the photolithography resolution. The exposure to light causes a chemical change that allows some of the patterned masking layer 140 soluble in a photographic developer.

Then, a post-exposure bake (PEB) may be performed before developing to help reduce standing wave phenomena caused by the destructive and constructive interference patterns of the incident light. The photographic developer is then applied onto the patterned masking layer 140 to remove the some of the patterned masking 140 soluble in the photographic developer, and therefore an opening 142 is formed in the remaining patterned masking layer 140. The remaining patterned masking layer 140 is then hard-baked to solidify the patterned masking layer 140. Then, during the photolithography and etching process, the portions of the first and second MEOL layers 122 and 124 which are not protected by the remaining patterned masking layer 140 are removed by etching to form the trench 126, and therefore the etch stop layer 118 is exposed. In some embodiments, the trench 126 formed by the etching is in an inverted-trapezoid shape. For example, in this exemplary embodiment, the trench 126 which is in an inverted-trapezoid shape has an inlet and a bottom, and a width of the inlet is greater than that of the bottom.

The etching performed on the first and second MEOL layers 122 and 124 may include dry etching, such as reactive ion etching (RIE), electron cyclotron resonance (ECR), eapacitively-coupled plasma (CCP) etching, or inductively coupled plasma (ICP) etching. In some embodiments, when the first and second MEOL layers 122 and 124 are made of silicon oxide, fluorine-based RIE can be used to form the trench 126. The gas etchant used to dry etch the first and second MEOL layers 122 and 124 is, for example, $CF_4/O_2$, $ClF_3$, $CCl_3F_5$, $SF_4/O_2$, or combinations thereof. Furthermore, the etching performed on the first and second MEOL layers 122 and 124 may be performed until reaching the etch stop layer 118.

Figure 6:
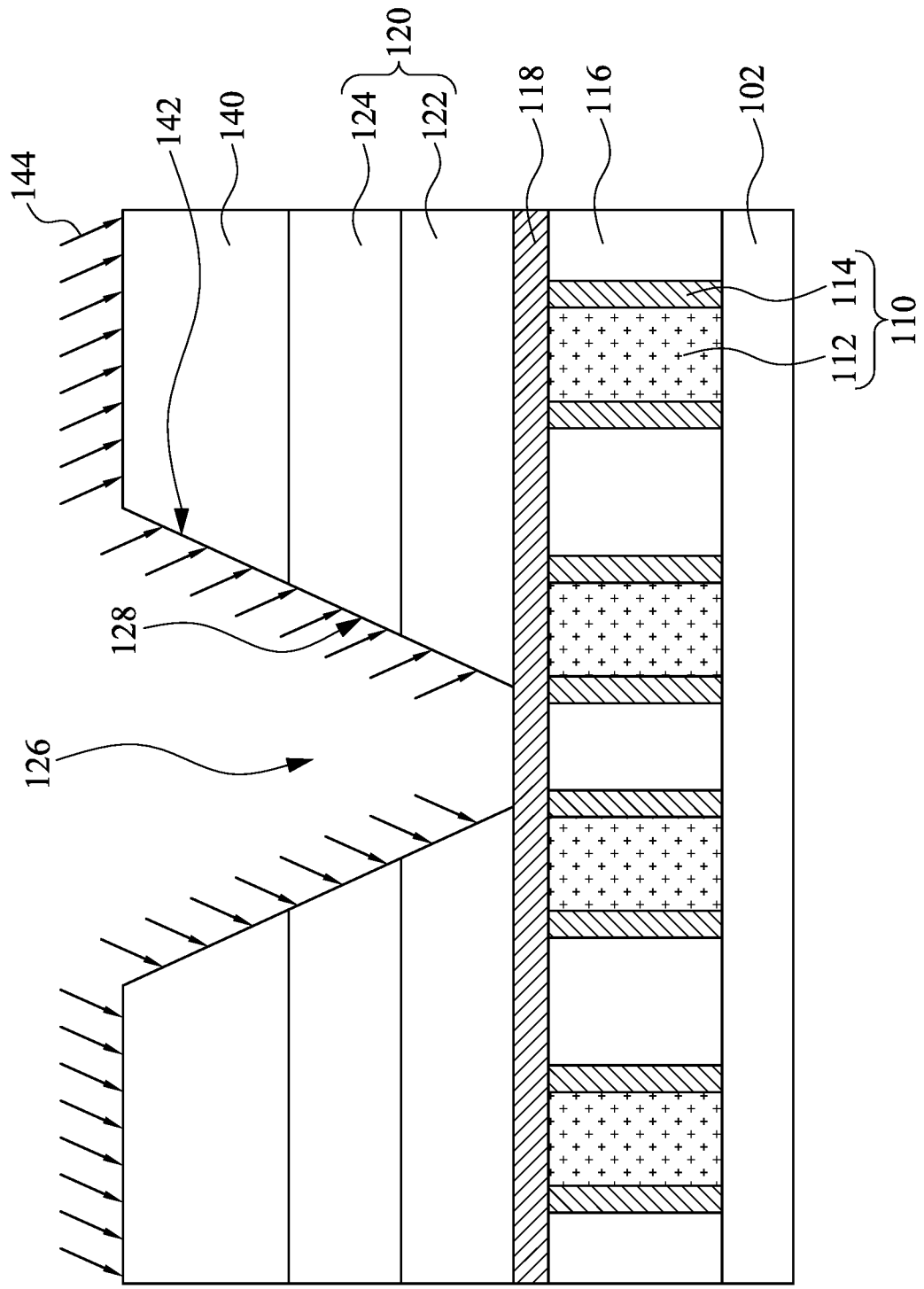

Reference is made to FIG. 6. An etching process is performed on the first and second MEOL layers 122 and 124 and the patterned masking layer 140. The etching process as described in FIG. 5 is referred to as a first etching, and the etching process as described in FIG. 6 is referred to as a second etching. The second etching may include an anisotropic etching, such as RIE, PE etching, or ICP etching. During the second etching which is involved with ion etching, ions 144 from plasma may be attracted across a plasma sheath (not illustrated in FIG. 6) and toward the first MEOL layer 122, the second MEOL layer 124, and the patterned masking layer 140. Accordingly, the ions 144 that are accelerated toward the first MEOL layer 122, the second MEOL layer 124, and the patterned masking layer 140 generally strike the first MEOL layer 122, the second MEOL layer 124, and the patterned masking layer 140 at an angle of incidence relative to a vector normal to the etch stop layer 118. In some embodiments, the angle is in a range from about −60° to about 60°. In some embodiments, plasma gas using in the ion beam etching is $CF_3$, $CF_4$, Ar, $N_2$, $H_2$, He, $SiH_4$, $Si_2H_6$, $CH_4$, $BF_3$, Xe, Ne, $GeH_4$, $PH_3$, or combinations thereof. Furthermore, since the patterned masking layer 140 is the highest one of the first MEOL layer 122, the second MEOL layer 124, and the patterned masking layer 140, the ions 144 may strike the first and second MEOL layers 122 and 124 through the trench 126. Accordingly, the first and second MEOL layers 122 and 124 may be removed by the second etching from at least one sidewall 128 of the trench 126.

Figure 7:
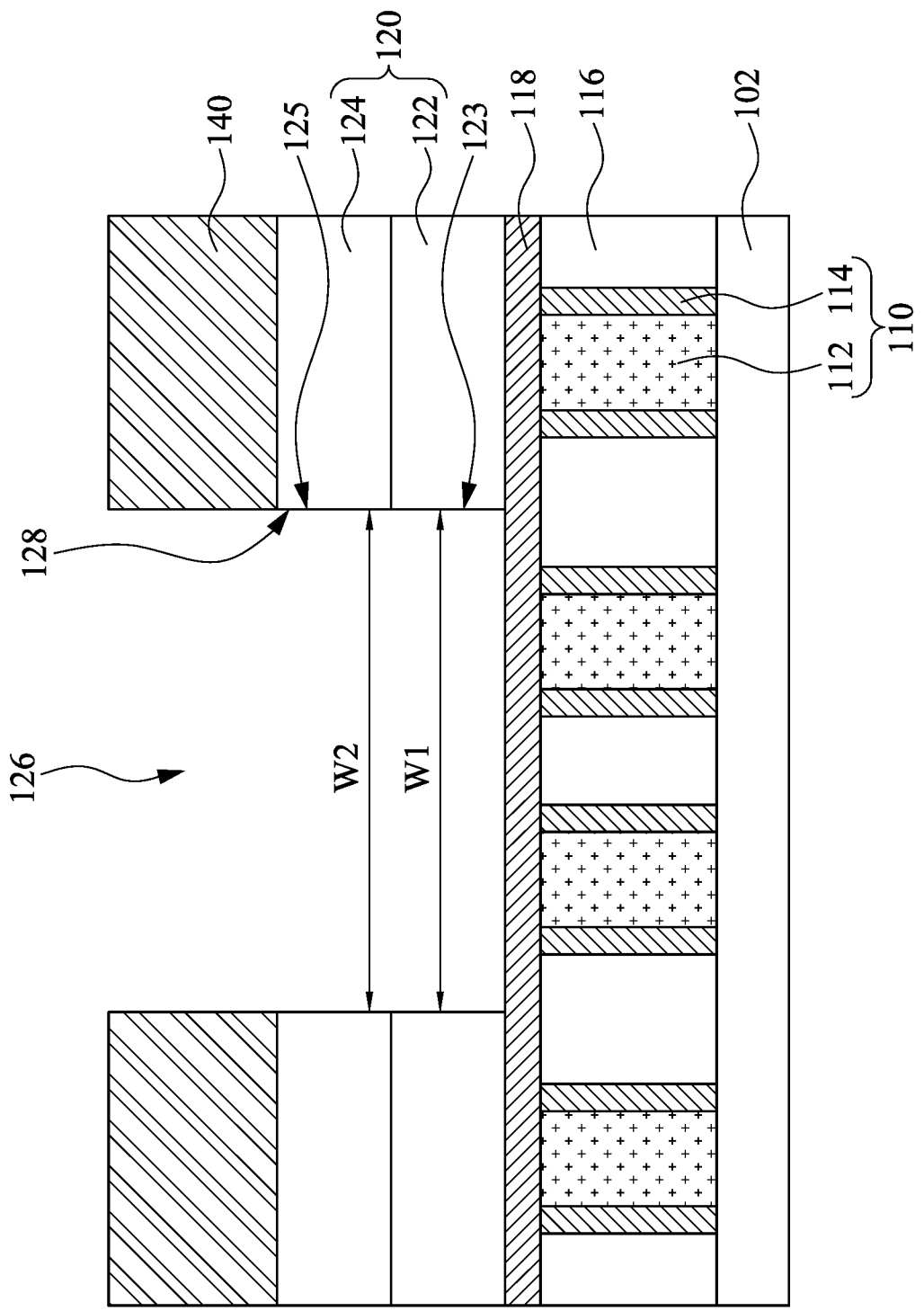

Reference is made to FIG. 7. Some portions of the first MEOL layer 122, the second MEOL layer 124, and the patterned masking layer 140 are removed after the second etching, so as to laterally enlarge the trench 126. For example, a width of the trench 126 is increased. Furthermore, the patterned masking layer 140 may become thinner. In some embodiments, after the second etching, the first MEOL layer 122 has an opening 123 having a width W1, and the second MEOL layer 124 has an opening 125 having a width W2 which is substantially the same as the width W1. In this exemplary embodiment, the openings 123 and 125 communication with each other to define the trench 126. Accordingly, since the widths W1 and W2 of the openings 123 and 125 are substantially the same, the trench 126 may be in a rectangular shape. For example, the 128 sidewall of the trench 126 can be normal to the etch stop layer 118.

After the trench 126 is laterally enlarged, the patterned masking layer 140 can be removed from the first MEOL structure 120 by, for example, plasma ashing, stripping, or combinations thereof. Plasma ashing uses a plasma source to generate a monatomic reactive species, such as oxygen or fluorine. The reactive species combines with the patterned masking layer 140 to form ash which is removed with a vacuum pump. Stripping uses a photoresist stripper, such as acetone or a phenol solvent, to remove the patterned masking layer 140 from the first MEOL structure 120.

With etching the first MEOL structure 120 twice, a profile of the sidewall 128 of the trench 126 can be adjusted. The first etching is performed for forming the inverted-trapezoid-shaped trench 126 in the first MEOL structure 120, and the second etching is performed for changing the trench 126 from the inverted trapezoid shape to the rectangular shape. In addition, in some embodiments, the patterned masking layer 140 can be omitted such that the second MEOL layer 124 is the topmost layer during the first etching and second etching.

Figure 8:
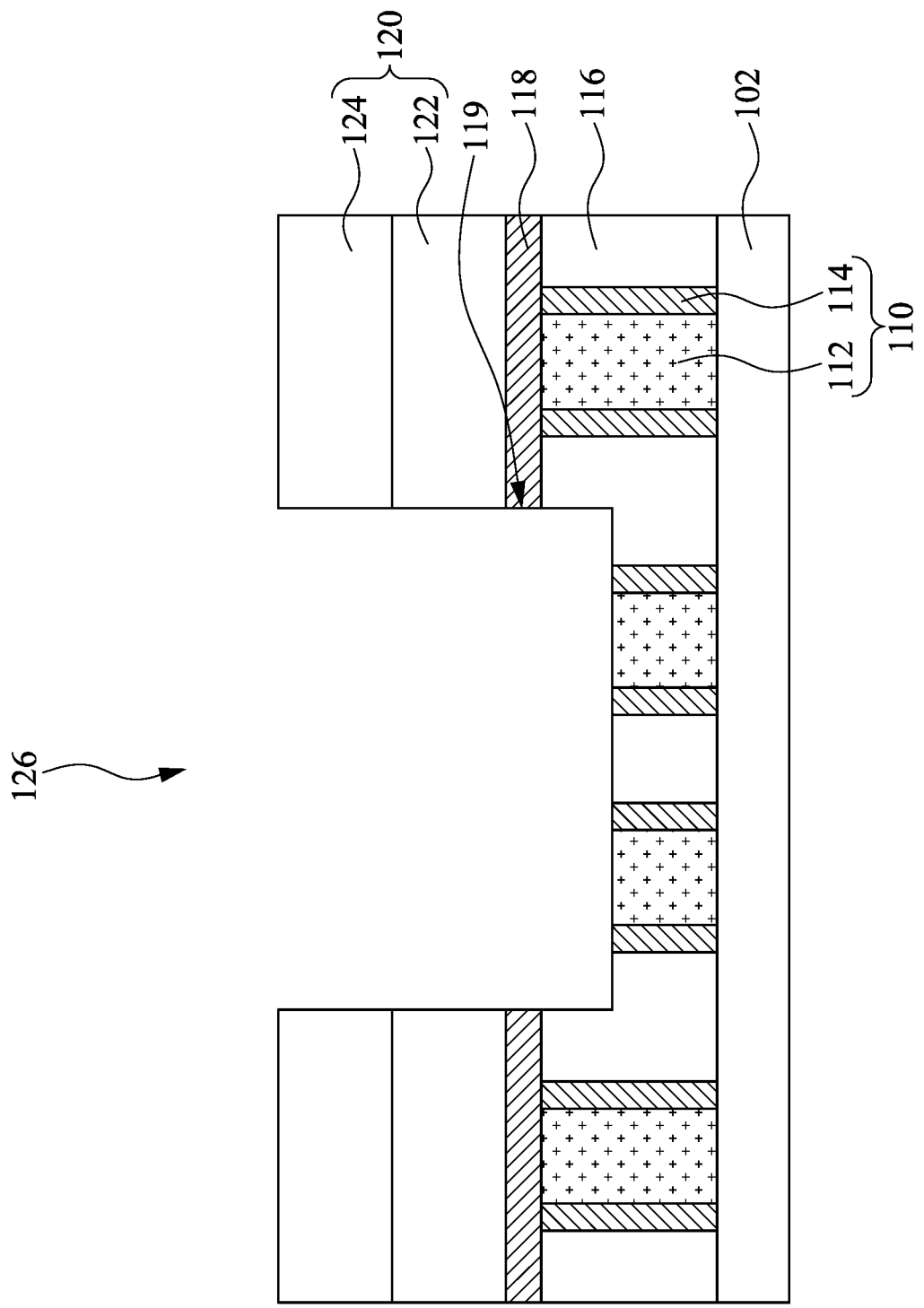

Reference is made to FIG. 8. At least one portion of the etch stop layer 118 which is exposed by the trench 126 is etched to form an opening 119. The opening 119 is in communication with the trench 126, and some portions of the gate structures 110 and the ILD layer 116 are exposed through the opening 119. The etching performed on the etch stop layer 118 may be dry etching, such as RIE, PE etching, or ICP etching. In some embodiments, when the etch stop layer 118 is made of silicon carbon nitride (SiCN), fluorine-based RIE can be used to form the opening 119, and the gas etchant of the RIE is, for example, $C_2F_6$, $CF_4/O_2$, $CF_4/H_2$, $C_3F_8$, or combinations thereof. After etching the etch stop layer 118, the exposed portions of the gate structures 110 and the ILD layer 116 are removed through the opening 119 to form a line-cut. In some embodiments, the removing the exposed portions of the gate structures 110 and the ILD layer 116 is performed by using an etching process, in which the first MEOL structure 120 can serve as a hard mask during the etching process.

Figure 9:
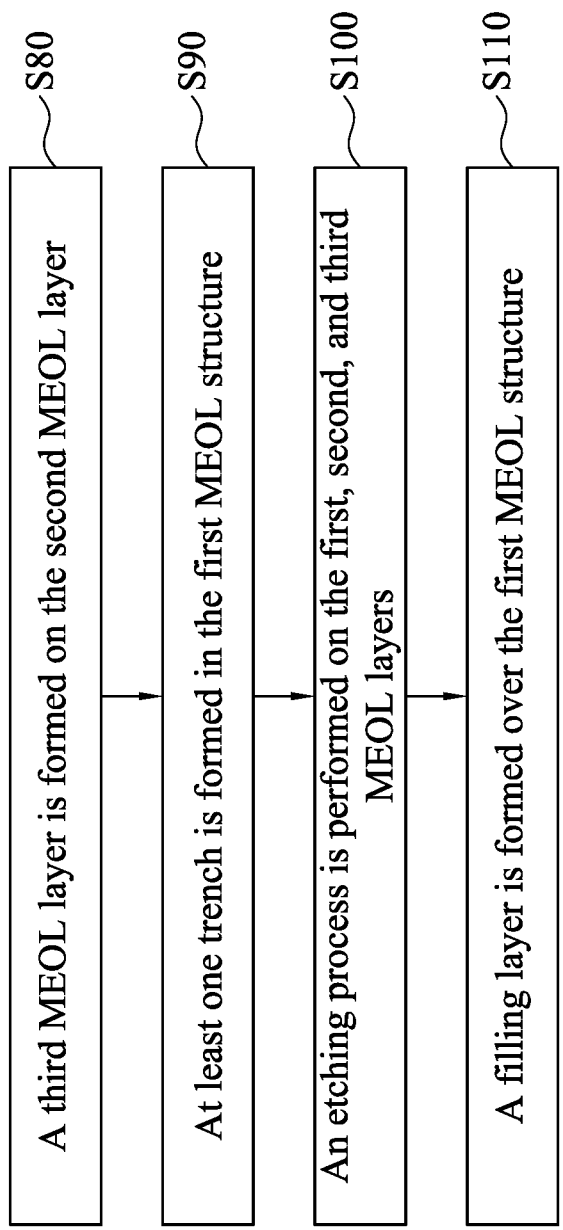
FIG. 9 is a flowchart of operations of a method for manufacturing a semiconductor structure in accordance with some embodiments of the present disclosure.

FIG. 9 is a flowchart of operations S80-110 of a method for manufacturing a semiconductor structure in accordance with some embodiments of the present disclosure. Operations performed before the block S80 are described as FIGS. 2-4, and hence they are not repeated herein. The method continues with block S80 in which a third MEOL layer is formed on the second MEOL layer. The method continues with block S90 in which at least one trench is formed in the first MEOL structure. The method continues with block S100 in which an etching process is performed on the first, second, and third MEOL layers. The method continues with block S110 in which a filling layer is formed over the first MEOL structure.

FIGS. 10-13 are cross-sectional views of the method for manufacturing a semiconductor structure in accordance with some embodiments of the present disclosure. The operations S80, S90, S100, and S110 mentioned above are respectively illustrated in FIGS. 10-13.

Figure 10:
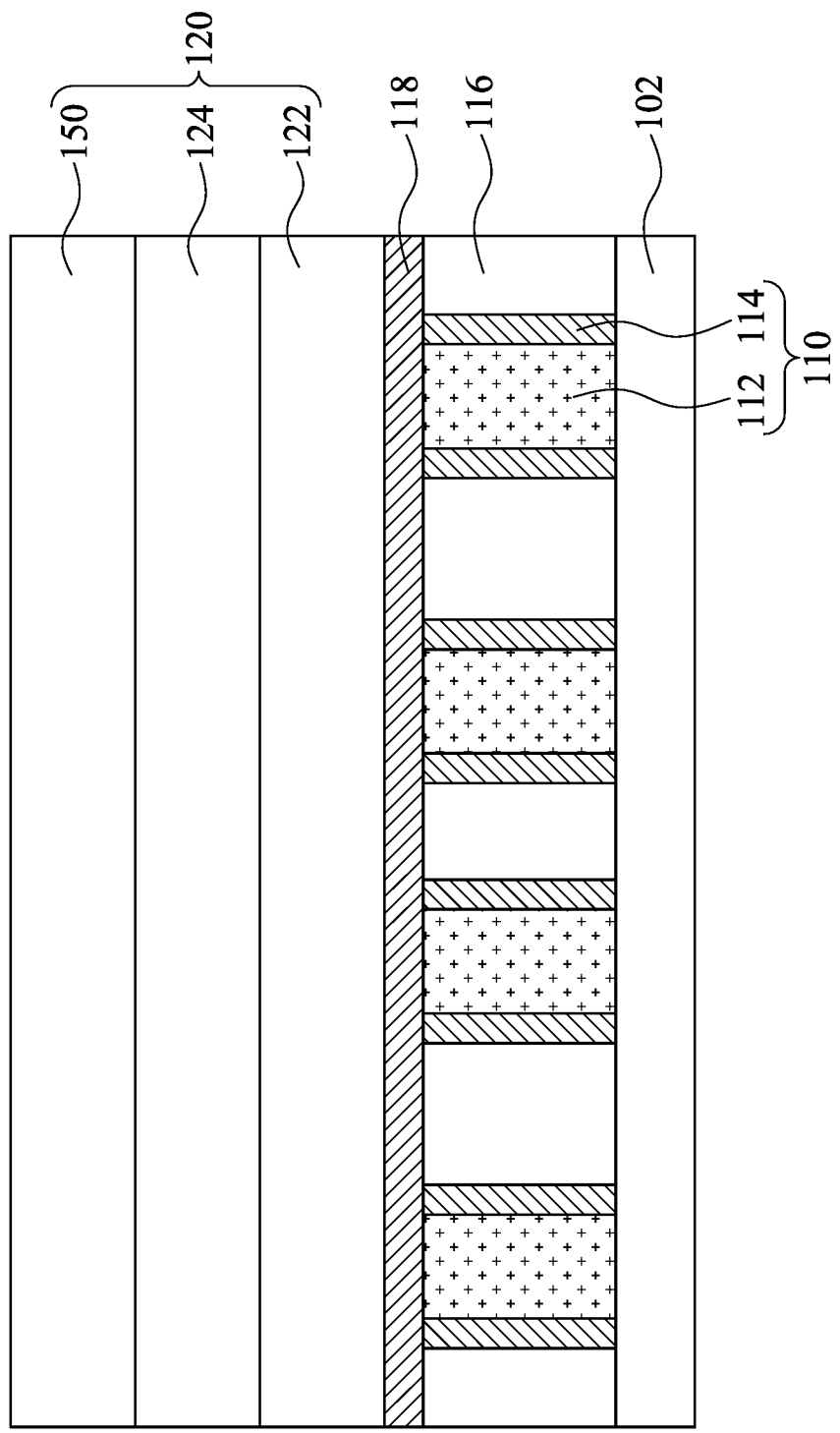
FIGS. 10-13 are cross-sectional views of the method for manufacturing a semiconductor structure in accordance with some embodiments of the present disclosure.

Reference is made to FIG. 10. A third MEOL layer 150 is formed on the second MEOL layer 124. Accordingly, in this exemplary embodiment, the first MEOL structure 120 can be defined by the first, second, and third MEOL layers 122, 124, and 150. In some embodiments, the third MEOL layer 150 is made of silicon nitride (SiN), silicon oxycarbide (SiOC), silicon oxycarbonitride (SiOCN), silicon carbonitride (SiCN), silicon (Si), silicon germanium (SiGe), oxide, tungsten (W), titanium nitride (TiN), hafnium dioxide (HfO2), zirconium dioxide (ZrO2), lanthanum oxide (La2O3), or combinations thereof. In some embodiments, the third MEOL layer 150 is formed by, for example, PVD, IPVD, ALD, CVD, or combinations thereof. In some embodiments, the number of the layers of the first MEOL structure 120 can be varied to increase or decrease. In some embodiments, the third MEOL layer 150 has a thickness in a range from about 10 nm to about 100 nm.

Figure 11:
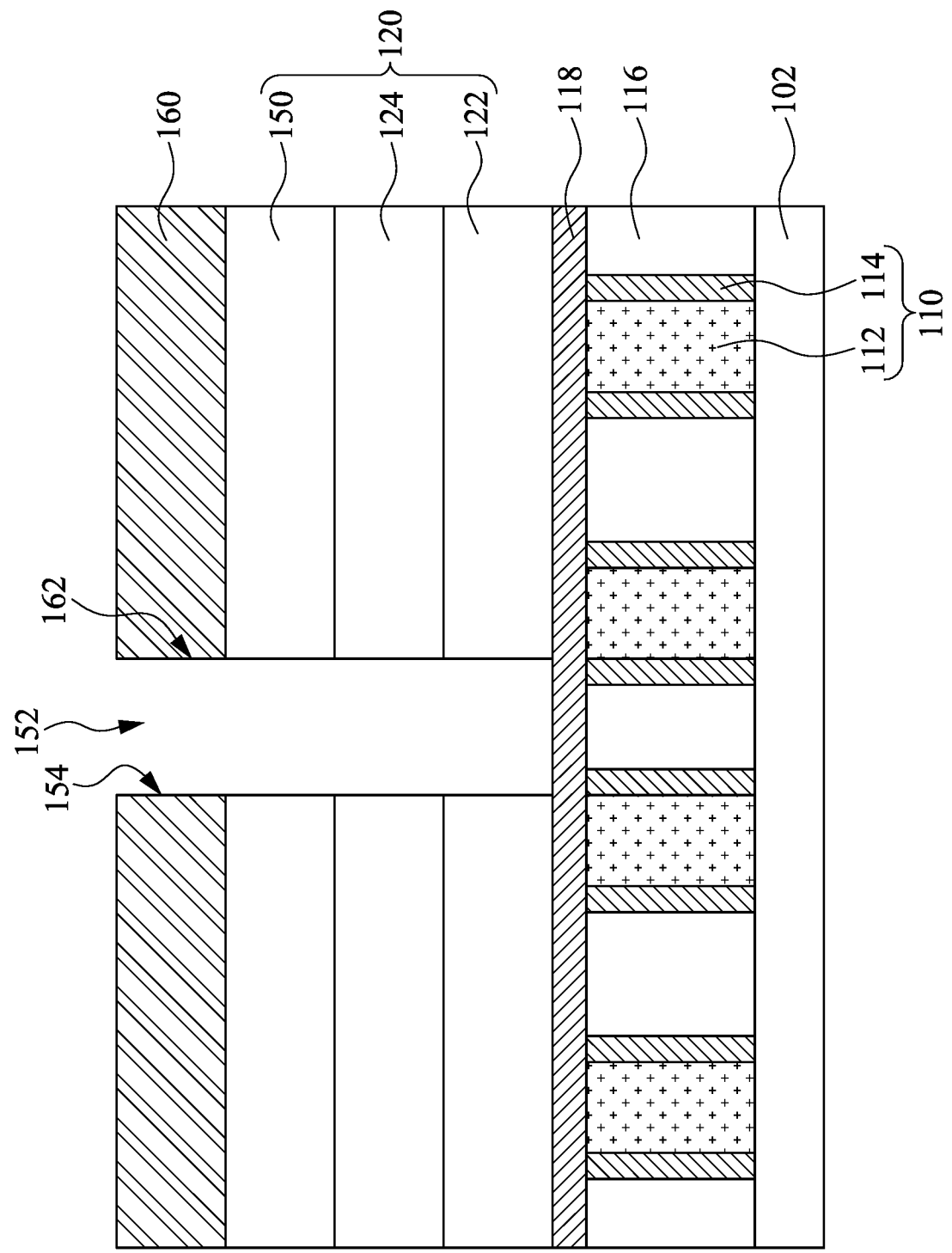

Reference is made to FIG. 11. At least one trench 152 is formed in the first MEOL structure 120. In some embodiments, the trench 152 is formed by removing some portions of the first, second, and third MEOL layers 122, 124, and 150. For example, the portions of the first, second, and third MEOL layers 122, 124, and 150 can be removed by using a photolithography and etching process. The photolithography and etching process includes photoresist application, exposure, developing, etching, and photoresist removal. For example, a patterned masking layer 160 can be applied onto the third MEOL layer 150 by spin coating a photoresist layer onto the third MEOL layer 150. Furthermore, in some embodiments, the patterned masking layer 160 includes a photoresist layer, a bottom anti-reflective coating (BARC) layer, amorphous carbon-hydrogen (a-C:H) layers, or combinations thereof. In some embodiments, the patterned masking layer 160 has a thickness in a range from about 10 nm to about 100 nm.

After the spin coating, the patterned masking layer 160 is then prebaked to drive off excess photoresist solvent. After prebaking, the patterned masking layer 160 is exposed to a pattern of intense light. The intense light is, for example, a G-line with a wavelength of about 436 nm, an I-line with a wavelength of about 365 nm, a krypton fluoride (KrF) excimer laser with a wavelength of about 248 nm, an argon fluoride (ArF) excimer laser with a wavelength of about 193 nm, a fluoride ($F_2$) excimer laser with a wavelength of about 157 nm, or combinations thereof. A space between the final lens of the exposure tool and a surface of the patterned masking layer 160 may be filled with a liquid medium that has a refractive index greater than one during the exposure to enhance the photolithography resolution. The exposure to light causes a chemical change that allows some of the patterned masking layer 160 soluble in a photographic developer.

Then, a post-exposure bake (PEB) may be performed before developing to help reduce standing wave phenomena caused by the destructive and constructive interference patterns of the incident light. The photographic developer is then applied onto the patterned masking layer 160 to remove the some of the patterned masking layer 160 soluble in the photographic developer, and therefore an opening 162 is formed in the remaining patterned masking layer 160. The remaining patterned masking layer 160 is then hard-baked to solidify the patterned masking layer 160. Then, during the photolithography and etching process, the portions of the first, second, and third MEOL layers 122, 124, and 150 which are not protected by the remaining patterned masking layer 160 are removed by etching to form the trench 152, and therefore the etch stop layer 118 is exposed. In some embodiments, the trench 152 formed by the etching is rectangular. For example, in this exemplary embodiment, at least one sidewall 154 of the trench 152 can be normal to the etch stop layer 118.

The etching performed on the first, second, and third MEOL layers 122, 124, and 150 may include dry etching, such as RIE, ECR, CCP etching, or ICP etching. In some embodiments, when the first, second, and third MEOL layers 122, 124, and 150 are made of silicon oxide, fluorine-based RIE can be used to form the trench 152. The gas etchant used to dry etch the first, second, and third MEOL layers 122, 124, and 150 is, for example, $CF_4/O_2$, $ClF_3$, $CCl_3F_5$, $SF_4/O_2$, or combinations thereof. Furthermore, the etching performed on the first, second, and third MEOL layers 122, 124, and 150 may be performed until reaching the etch stop layer 118.

Figure 12:
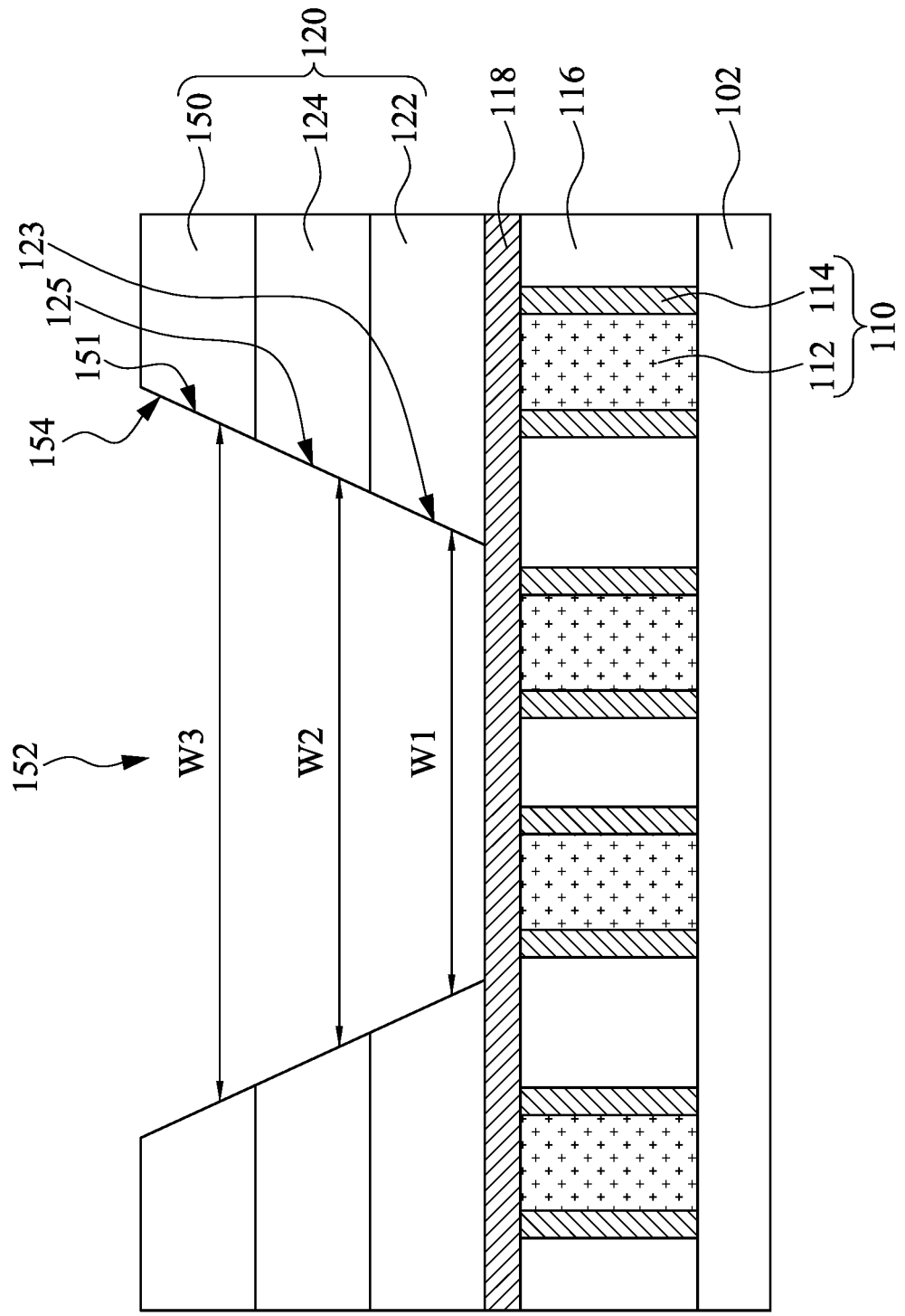

Reference is made to FIG. 12. An etching process is performed on the first, second, and third MEOL layers 122, 124, and 150. The etching process as described in FIG. 11 is referred to as a first etching, and the etching process as described in FIG. 12 is referred to as a second etching. The second etching includes an anisotropic etching, such as RIE, PE etching, or ICP etching. During the second etching which is involved with ion etching, ions are accelerated toward the first, second, and third MEOL layers 122, 124, and 150 and the patterned masking layer 160, and the ions may generally strike the first, second, and third MEOL layers 122, 124, and 150 and the patterned masking layer 160 at an angle of incidence relative to a vector normal to the etch stop layer 118. In some embodiments, the angle is in a range from about −60° to 60°. In some embodiments, plasma gas using in the ion beam etching is $CF_3$, $CF_4$, Ar, $N_2$, $H_2$, He, $SiH_4$, $Si_2H_6$, $CH_4$, $BF_3$, Xe, Ne, $GeH_4$, $PH_3$, or combinations thereof. Furthermore, since the patterned masking layer 160 is the highest one of the first, second, and third MEOL layers 122, 124, and 150 and the patterned masking layer 160, the ions may strike the first, second, and third MEOL layers 122, 124, and 150 through the trench 152. Accordingly, the first, second, and third MEOL layers 122, 124, and 150 may be removed by the second etching from at least one sidewall 154 of the trench 152.

After the second etching, some portions of the first, second, and third MEOL layers 122, 124, and 150 are removed, such that the trench 152 is laterally enlarged. In this exemplary embodiment, the first MEOL layer 122 has an opening 123 having a width W1, the second MEOL layer 124 has an opening 125 having a width W2, and the third MEOL layer 150 has an opening 151 having a width W3. In this exemplary embodiment, the openings 125 is in communication with the openings 123 and 151 to define the trench 152, and the width W1 is less than the width W2 and the width W2 is less than the width W3. Accordingly, since the width W1 is less than the width W2 and the width W2 is less than the width W3, the trench 152 is in an inverted-trapezoid shape. For example, the inverted-trapezoid-shaped trench 152 has an inlet coinciding with the opening 151 and a bottom coinciding with the opening 123, and a width of the inlet is greater than that of the bottom. In some embodiments, the width of the inverted-trapezoid-shaped trench 152 increases from the inlet toward the bottom. In some embodiments, the sidewall 154 of the trench 152 slants to the etch stop layer 118.

After the trench 152 is laterally enlarged, the patterned masking layer 160 can be removed from the first MEOL structure 120 by, for example, plasma ashing, stripping, or combinations thereof. Plasma ashing uses a plasma source to generate a monatomic reactive species, such as oxygen or fluorine. The reactive species combines with the patterned masking layer 140 to form ash which is removed with a vacuum pump. Stripping uses a photoresist stripper, such as acetone or a phenol solvent, to remove the patterned masking layer 160 from the first MEOL structure 120.

With etching the first, second, and third MEOL layers 122, 124, and 150 twice, a profile of the sidewall 154 of the trench 152 can be adjusted. The first etching is performed for forming the rectangular trench 152 in the first MEOL structure 120, and the second etching is performed for changing the trench 152 from the rectangular shape to the inverted-trapezoid shape. Furthermore, with the second etching, the trench 152 can be laterally enlarged so as to perform sequent process, such as a gap filling process. In some embodiments, the patterned masking layer 160 can be omitted such that the third MEOL layer 150 is the topmost layer during the first etching and the second etching.

Figure 13:
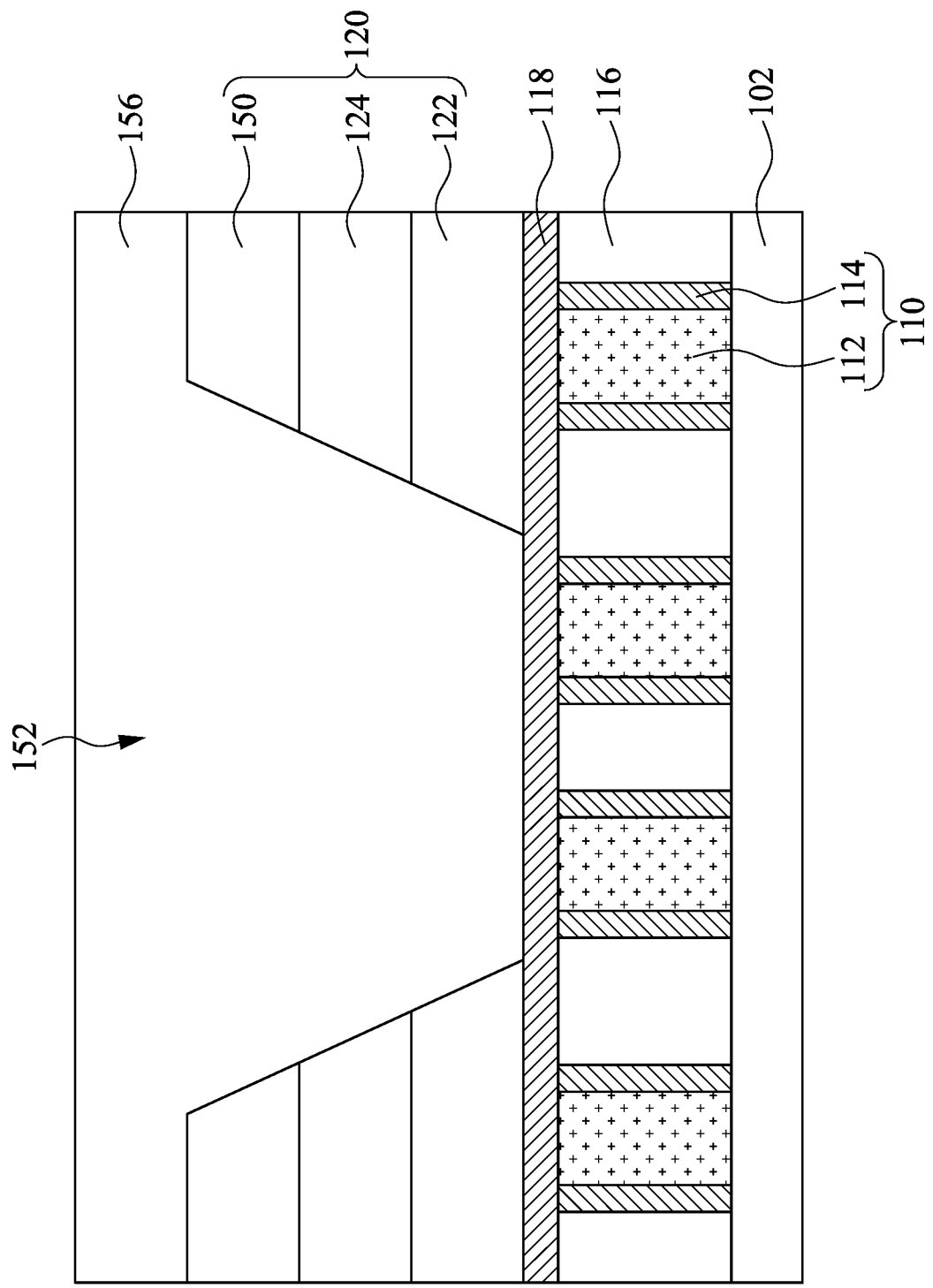

Reference is made to FIG. 13. A filling layer 156 is formed over the first MEOL structure 120. The trench 152 is filled with a portion of the filling layer 156, and the portion of the filling layer 156 is in contact with the etch stop layer 118. In some embodiments, the filling layer 156 is made of a dielectric material, such as silicon nitride (SiN), silicon oxycarbide (SiOC), silicon oxycarbonitride (SiOCN), silicon carbonitride (SiCN), silicon (Si), silicon germanium (SiGe). In some embodiments, the filling layer 156 is made of a conductive material, such as tungsten (W), titanium nitride (TiN), or combination thereof. In some embodiments, the filling layer 156 is made of an oxide material, such as hafnium dioxide ($HfO_2$), zirconium dioxide ($ZrO_2$), lanthanum oxide ($La_2O_3$), or combinations thereof. In some embodiments, the filling layer 156 is formed by, for example, PVD, IPVD, ALD, CVD, or combinations thereof. In some embodiments, a planarization process, such as a CMP process, is performed on the filling layer 156 until reaching the first MEOL structure 120. After the planarization process, the remained filling layer 156 is within the trench 152. In some embodiments, before the formation of the filling layer 156, at least one portion of the etch stop layer 118 which is exposed by the trench 178 is etched to form an opening in the etch stop layer 118. Some portions of the gate structures 110 and the ILD layer 116 are exposed through the opening as described in FIG. 8, and then the filling layer 156 is formed in contact with the exposed portions of the gate structures 110. In some embodiments, after the opening is formed in the etch stop layer 118, the exposed portions of the gate structures 110 and the ILD layer 116 are removed through the opening to form a line-cut as described in FIG. 8, and then the filling layer 156 is formed in contact with the gate structures 110.

Figure 14:
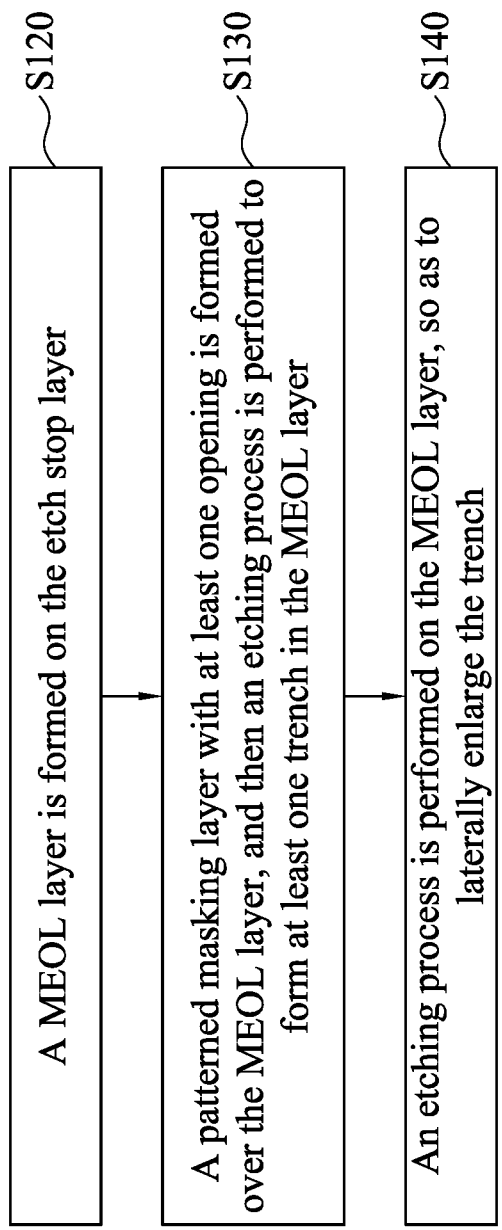
FIG. 14 is a flowchart of operations of a method for manufacturing a semiconductor structure in accordance with some embodiments of the present disclosure.

FIG. 14 is a flowchart of operations S120-140 of a method for manufacturing a semiconductor structure in accordance with some embodiments of the present disclosure. Operations performed before the block S120 are as described in FIGS. 2-3, and hence they are not repeated herein. The method continues with block S120 in which a MEOL layer is formed on the etch stop layer. The method continues with block S130 in which a patterned masking layer with at least one opening is formed over the MEOL layer, and then an etching process is performed to form at least one trench in the MEOL layer. The method continues with block S140 in which an etching process is performed on the MEOL layer, so as to laterally enlarge the trench.

Figure 15:
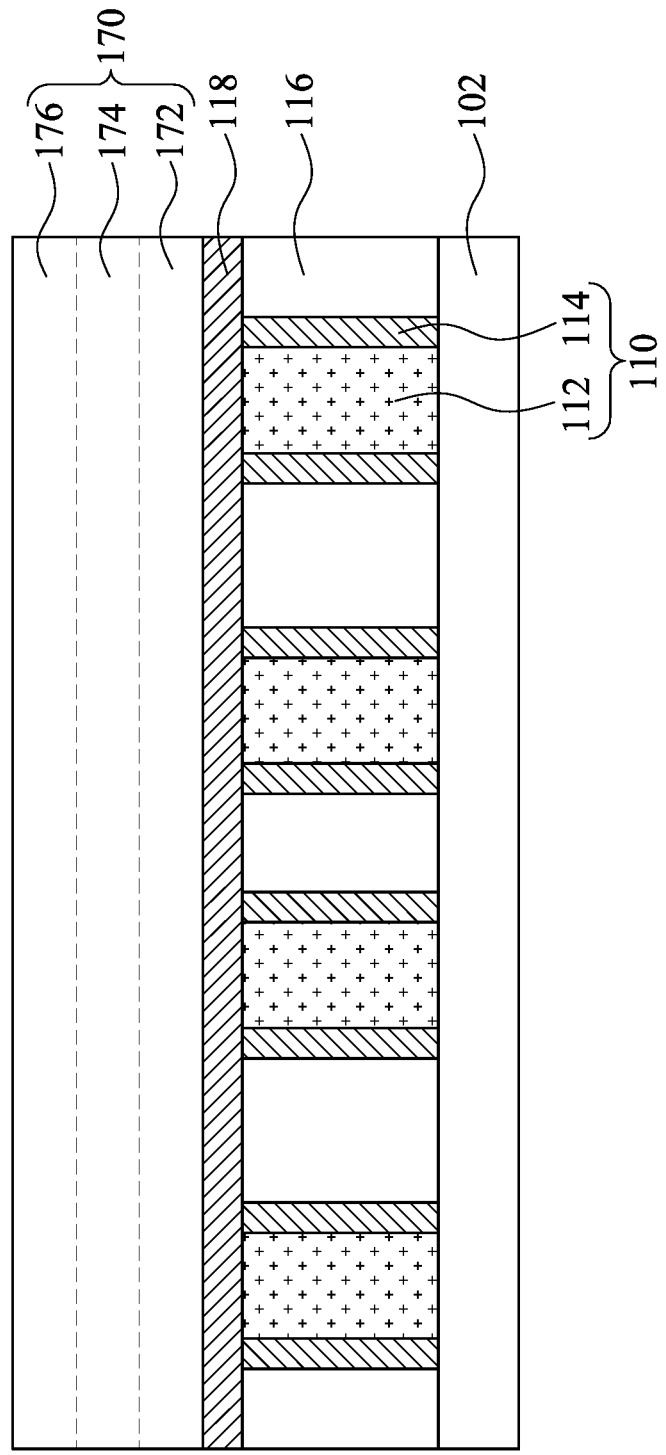
FIGS. 15-17 are cross-sectional views of the method for manufacturing a semiconductor structure in accordance with some embodiments of the present disclosure.
Figure 16:
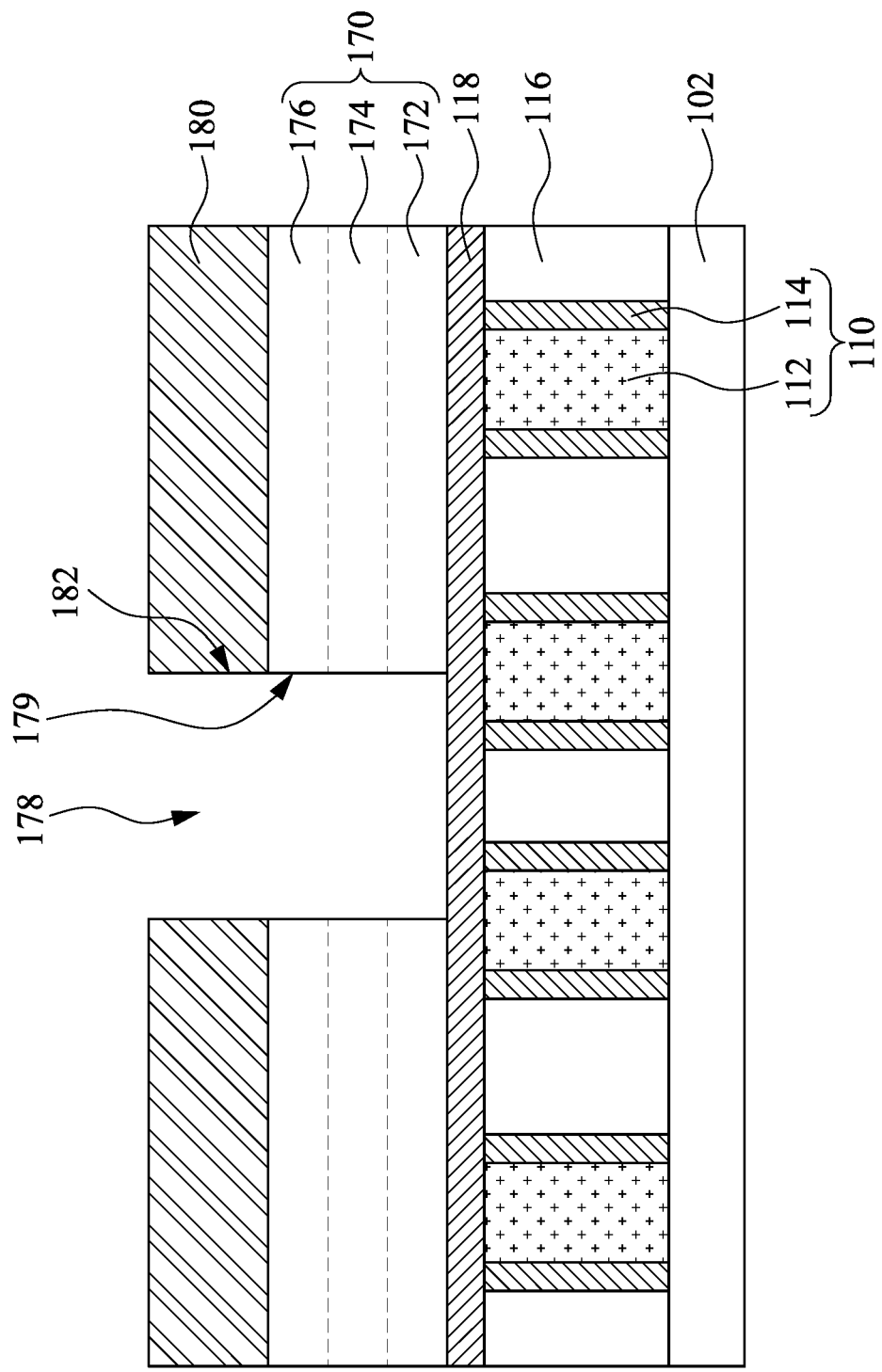
Figure 17:
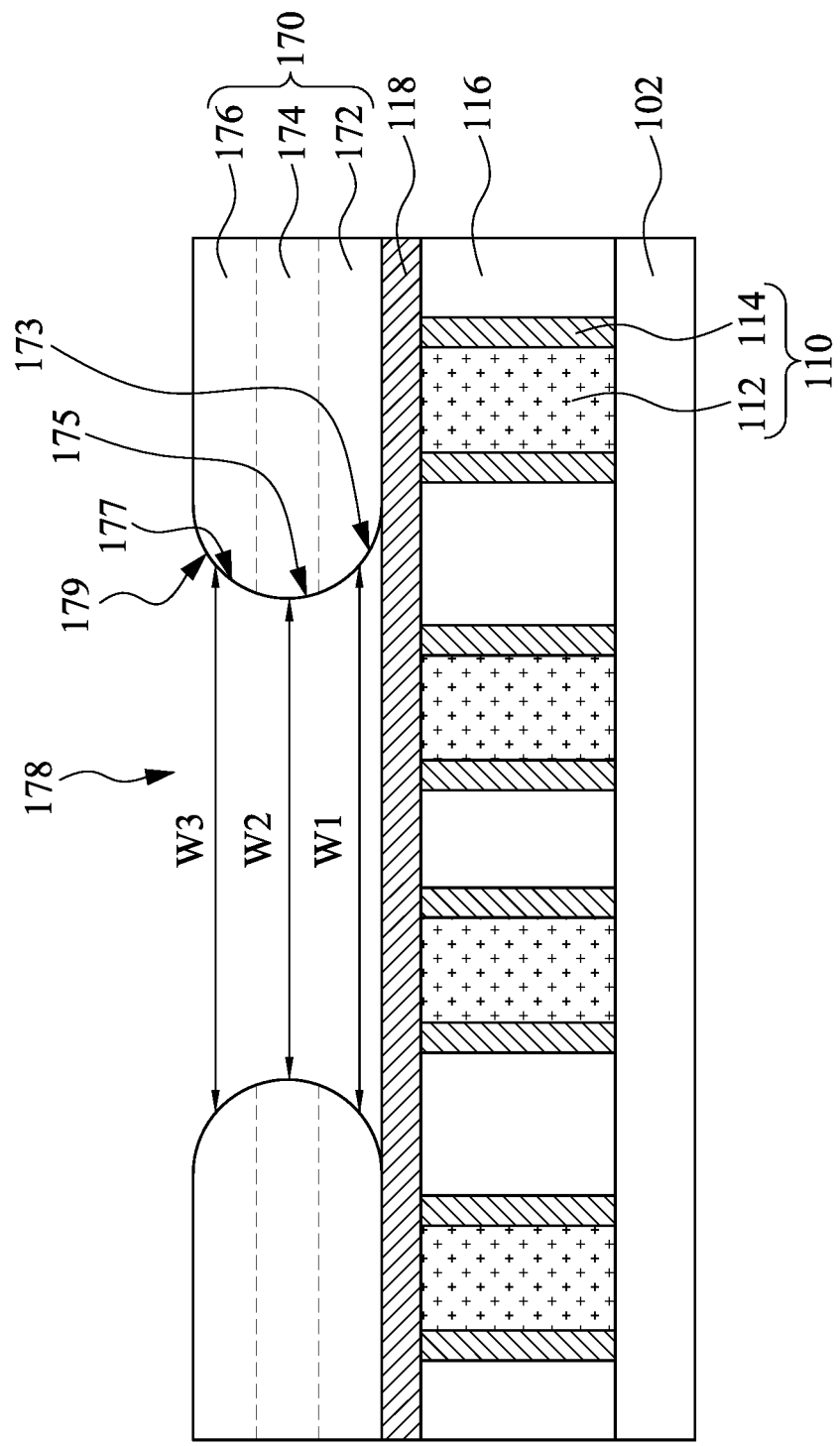

FIGS. 15-17 are cross-sectional views of the method for manufacturing a semiconductor structure in accordance with some embodiments of the present disclosure. In this exemplary embodiment, the operations S120, S130, and S140 mentioned above can be performed respectively as illustrated in FIGS. 15-17.

Reference is made to FIG. 15. A fourth MEOL layer 170 is formed on the etch stop layer 118. In some embodiments, the fourth MEOL layer 170 is made of silicon nitride (SiN), silicon oxycarbide (SiOC), silicon oxycarbonitride (SiOCN), silicon carbonitride (SiCN), silicon (Si), silicon germanium (SiGe), oxide, tungsten (W), titanium nitride (TiN), hafnium dioxide ($HfO_2$), zirconium dioxide ($ZrO_2$), lanthanum oxide ($La_2O_3$), or combinations thereof. In some embodiments, the fourth MEOL layer 170 is formed by, for example, PVD, IPVD, ALD, CVD, or combinations thereof. In some embodiments, the fourth MEOL layer 170 has a thickness in a range from about 10 nm to about 100 nm.

In some embodiments, the fourth MEOL layer 170 is made of a compound including a first material and a second material, such as silicon nitride (SiN), and a ratio of the first material to the second material may vary with a height from the etch stop layer 118. For example, in this exemplary embodiment, the fourth MEOL layer 170 includes a bottom portion 172, a middle portion 174, and a top portion 176, and a ratio of the first material to the second material in the middle portion 174 may be different from those in the bottom and top portions 172 and 176. The different ratios of the first material to the second material in the bottom, central, and top portions 172, 174, and 176 can be achieved by controlling at least one parameter during the formation of the fourth MEOL layer 170. In some embodiments, during the formation of the different portions of the fourth MEOL layer 170, a process recipe, such as pressure or temperature, can be controlled. For example, the process recipe for forming the bottom portion 172 may be different from the process recipe for forming the middle portion 174. In some embodiments, as the fourth MEOL layer 170 is made of a compound including the first material and the second material, different precursors for forming the compound may be used, in which different portions of the fourth MEOL layer 170 may be formed by the different precursors. For example, the middle portion 174 can formed by a precursor of tris(dimethylamino)silane (3DMAS), and the top portion 176 can formed by a precursor of trisilylamine (TSA). In some embodiments, there exists a distinguishable interface between the adjacent two portions. In alternative embodiments, the adjacent two portions may be merged with no distinguishable interface therebetween.

The ratio of the first material to the second material may be related to some properties. For example, since the ratio of the first material to the second material in the middle portion 174 is different from those in the bottom and top portions 172 and 176, an etch resistance property of the middle portion 174 to an etchant may be different from those of the bottom and top portions 172 and 176 to the same etchant. In some embodiments, etching resistance of the middle portion 174 to an etchant is different from those of the bottom and top portions 172 and 176, and the etching resistance of the bottom portion 172 to the etchant is the same as that of the top portion 176. In some embodiments, the etching resistance of the middle portion 174 to the etchant is greater than those of the bottom and top portions 172 and 176. In alternative embodiments, the etching resistance of the middle portion 174 to the etchant is less than those of the bottom and top portions 172 and 176. Accordingly, the fourth MEOL layer 170 has etching resistance to an etchant that varies from the bottom portion 172 to the middle portion 174 and that varies from the middle portion 174 to the top portion 176. For example, the etch resistance of the MEOL layer can gradually increase or decrease from bottom portion 172 to the middle portion 174, and then the etch resistance of the MEOL layer can gradually increase or decrease from the middle portion 174 to the top portion 176 as well.

Reference is made to FIG. 16. A patterned masking layer 180 with at least one opening 182 is formed over the fourth MEOL layer 170. The patterned masking layer 180 may include a photoresist layer, a bottom anti-reflective coating (BARC) layer, amorphous carbon-hydrogen (a-C:H) layers, or combinations thereof, as to serve as a hard mask. In some embodiments, the patterned masking layer 180 has a thickness in a range from about 10 nm to about 100 nm. Then, an etching process is performed to form at least one trench 178 in the fourth MEOL layer 170. The etching process may include wet etching processes or dry etching process such as for example reactive ion etching techniques or plasma etching techniques. The etching process performed on the fourth MEOL layer 170 may be dry etching, such as RIE, ECR, CCP etching, or ICP etching. In some embodiments, the gas etchant used to dry etch the fourth MEOL layer 170 is, for example, $CF_4/O_2$, $ClF_3$, $CCl_3F_5$, $SF_4/O_2$, or combinations thereof. In this exemplary embodiment, after the etching process, the trench 178 is rectangular, and at least one sidewall 179 of the trench 178 is normal to the etch stop layer 118.

Reference is made to FIG. 17. An etching process is performed on the fourth MEOL layer 170, so as to laterally enlarge the trench 178. The etching process as described in FIG. 16 is referred to as a first etching, and the etching process as described in FIG. 17 is referred to as a second etching. The second etching includes an anisotropic etching, such as RIE, PE etching, or ICP etching. During the second etching which is involved with ion etching, ions are accelerated toward the fourth MEOL layer 170, and the ions generally strike the fourth MEOL layer 170 at an angle of incidence relative to a vector normal to the etch stop layer 118. In some embodiments, the angle is in a range from about −60° to 60°. In some embodiments, plasma gas using in the ion beam etching is $CF_3$, $CF_4$, Ar, $N_2$, $H_2$, He, $SiH_4$, $Si_2H_6$, $CH_4$, $BF_3$, Xe, Ne, $GeH_4$, $PH_3$, or combinations thereof.

During the second etching, the fourth MEOL layer 170 is covered with the patterned masking layer 180 (see FIG. 16), and at least one portions of the fourth MEOL layer 170 exposed from the trench 178 is removed. Furthermore, in this exemplary embodiment, etching resistance of the middle portion 174 to an etchant used in the second etching is greater than those of the bottom and top portions 172 and 176. Accordingly, since the etching resistance of the middle portion 174 is greater than those of the bottom and top portions 172 and 176, the sidewall 179 of the trench 178 is modified to become curved after the second etching. For example, the removed volume of the middle portion 174 may be less than that of the bottom portion 172 or the top portion 176.

In some embodiments, the bottom portion 172 has an opening 173 having a width W1, the middle portion 174 has an opening 175 having a width W2, the top portion 176 has an opening 177 having a width W3, in which the width W2 is smaller than the widths W1 and W3. In some embodiments, the widths W1 of the opening 173 is the same as the widths W3 of the opening 177. In this exemplary embodiment, since the opening 175 of the middle portion 174 has the width W2 smaller than those of the openings 173 and 177 of the bottom and top portions 172 and 176, the fourth MEOL layer 170 is convex toward the trench 178. In some embodiments, the width W1 is in a range from about 10 nm to about 70 nm. In some embodiments, the width W2 is in a range from about 10 nm to about 70 nm. In some embodiments, the width W3 is in a range from about 10 nm to about 70 nm.

After the trench 178 is laterally enlarged, the patterned masking layer 180 (see FIG. 16) can be removed from the fourth MEOL layer 170 by, for example, plasma ashing, stripping, or combinations thereof. Plasma ashing uses a plasma source to generate a monatomic reactive species, such as oxygen or fluorine. The reactive species combines with the patterned masking layer 180 to form ash which is removed with a vacuum pump. Stripping uses a photoresist stripper, such as acetone or a phenol solvent, to remove the patterned masking layer 180 from the fourth MEOL layer 170.

In some embodiments, the fourth MEOL layer 170 may be etched to become concave from the trench 178 in accordance with other embodiments. For example, etching resistance of the middle portion 174 to an etchant used in the second etching is less than those of the bottom and top portions 172 and 176, and therefore the fourth MEOL layer 170 can be concave from the trench 178 after the second etching. In some embodiments, after the second etching, a filling layer can be formed within the trench 178. For example, FIG. 18 is a cross-sectional view of the method for manufacturing the semiconductor structure in accordance with some embodiments of the present disclosure.

Figure 18:
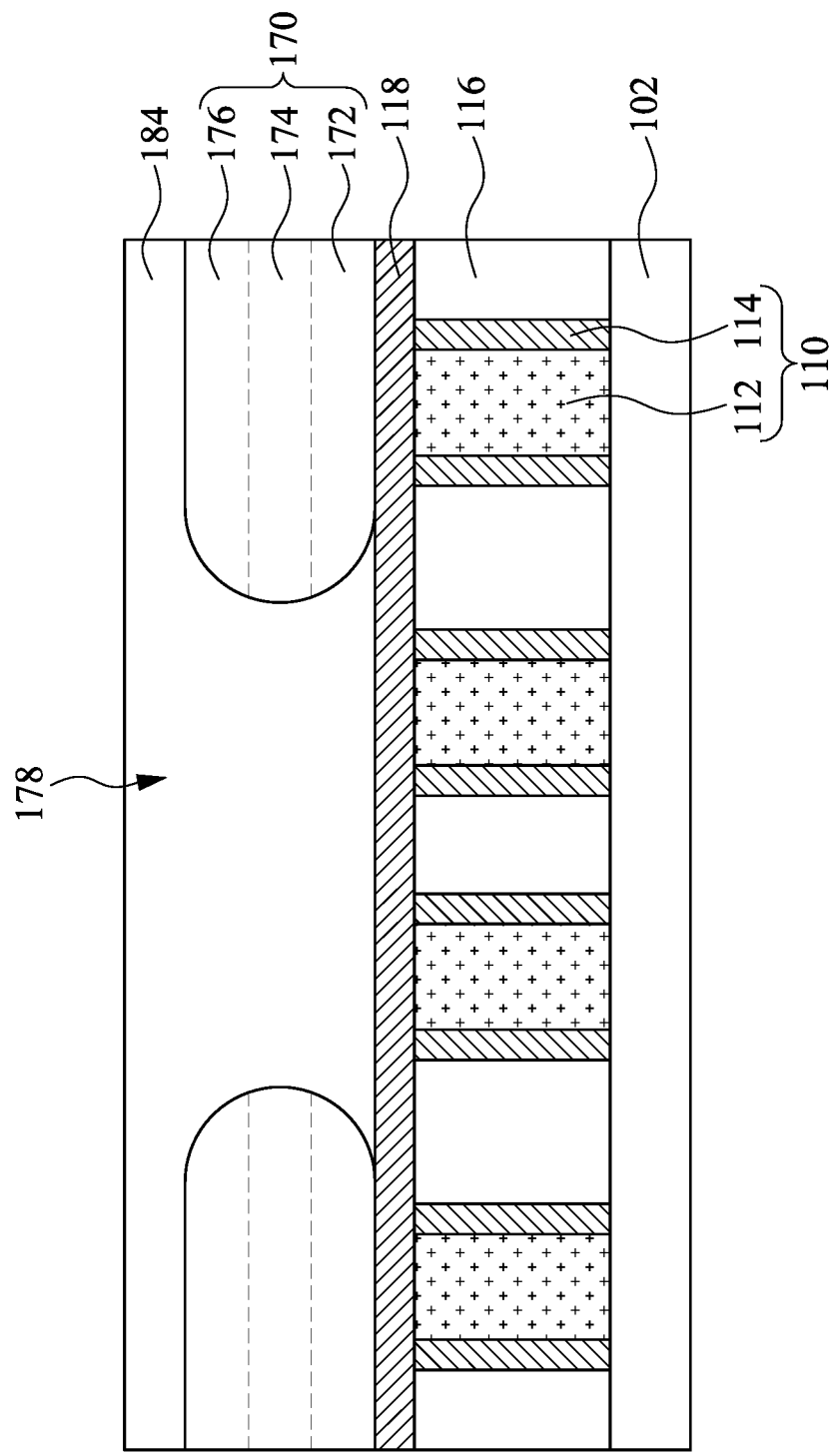
FIG. 18 is a cross-sectional view of the method for manufacturing a semiconductor structure in accordance with some embodiments of the present disclosure.

As shown in FIG. 18, a filling layer 184 is formed over the fourth MEOL layer 170. The trench 178 is filled with a portion of the filling layer 184, and the portion of the filling layer 184 is in contact with the etch stop layer 118. In some embodiments, the filling layer 184 is made of a dielectric material, such as silicon nitride (SiN), silicon oxycarbide (SiOC), silicon oxycarbonitride (SiOCN), silicon carbonitride (SiCN), silicon (Si), silicon germanium (SiGe). In some embodiments, the filling layer 184 is made of a conductive material, such as tungsten (W), titanium nitride (TiN), or combination thereof. In some embodiments, the filling layer 184 is made of an oxide material, such as hafnium dioxide (HfO$_2$), zirconium dioxide (ZrO$_2$), lanthanum oxide (La$_2$O$_3$), or combinations thereof. In some embodiments, the filling layer 184 is formed by, for example, PVD, IPVD, ALD, CVD, or combinations thereof. In some embodiments, a planarization process, such as a CMP process, is performed on the filling layer 184 until reaching the fourth MEOL layer 170. After the planarization process, the remained filling layer 184 is within the trench 178. In some embodiments, before the formation of the filling layer 184, at least one portion of the etch stop layer 118 which is exposed by the trench 178 is etched to form an opening in the etch stop layer 118. Some portions of the gate structures 110 and the ILD layer 116 are exposed through the opening as described in FIG. 8, and then the filling layer 184 is formed in contact with the exposed portions of the gate structures 110. In some embodiments, after the opening is formed in the etch stop layer 118, the exposed portions of the gate structures 110 and the ILD layer 116 are removed through the opening to form a line-cut as described in FIG. 8, and then the filling layer 184 is formed in contact with the gate structures 110.

Figure 19:
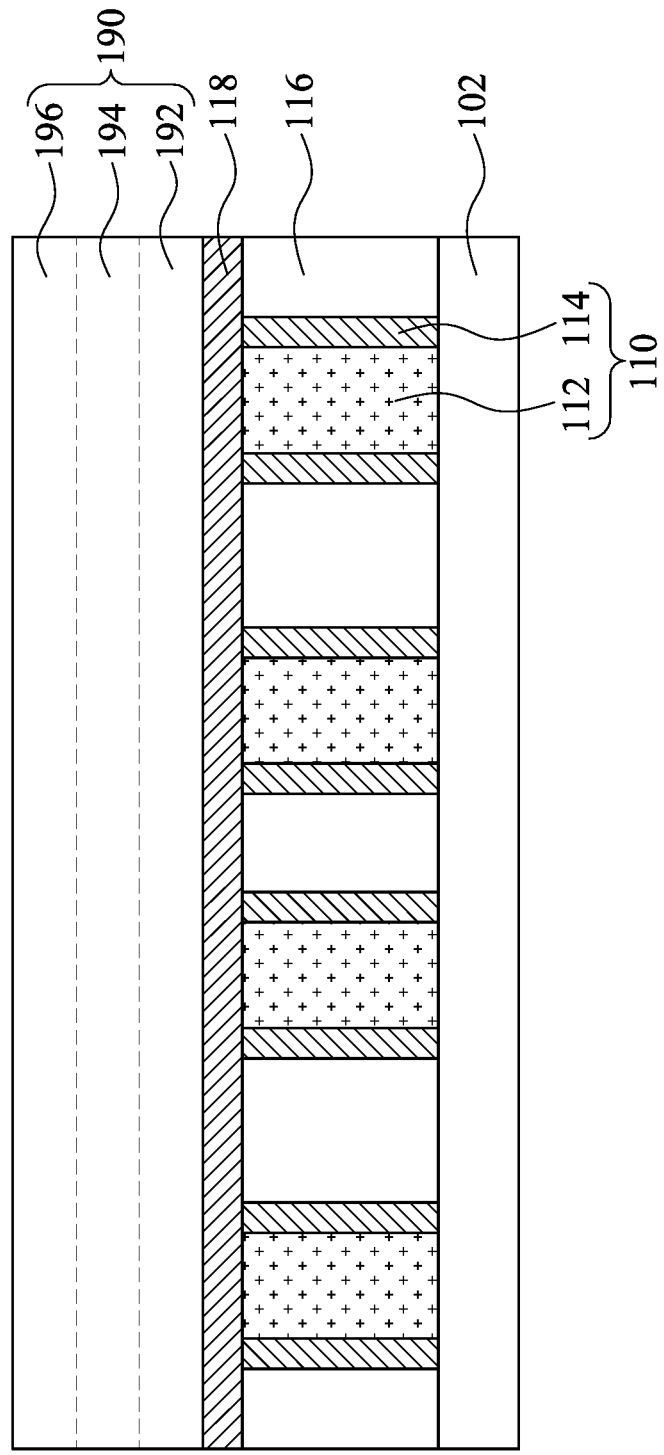
FIGS. 19-21 are cross-sectional views of the method for manufacturing a semiconductor structure in accordance with some embodiments of the present disclosure.
Figure 20:
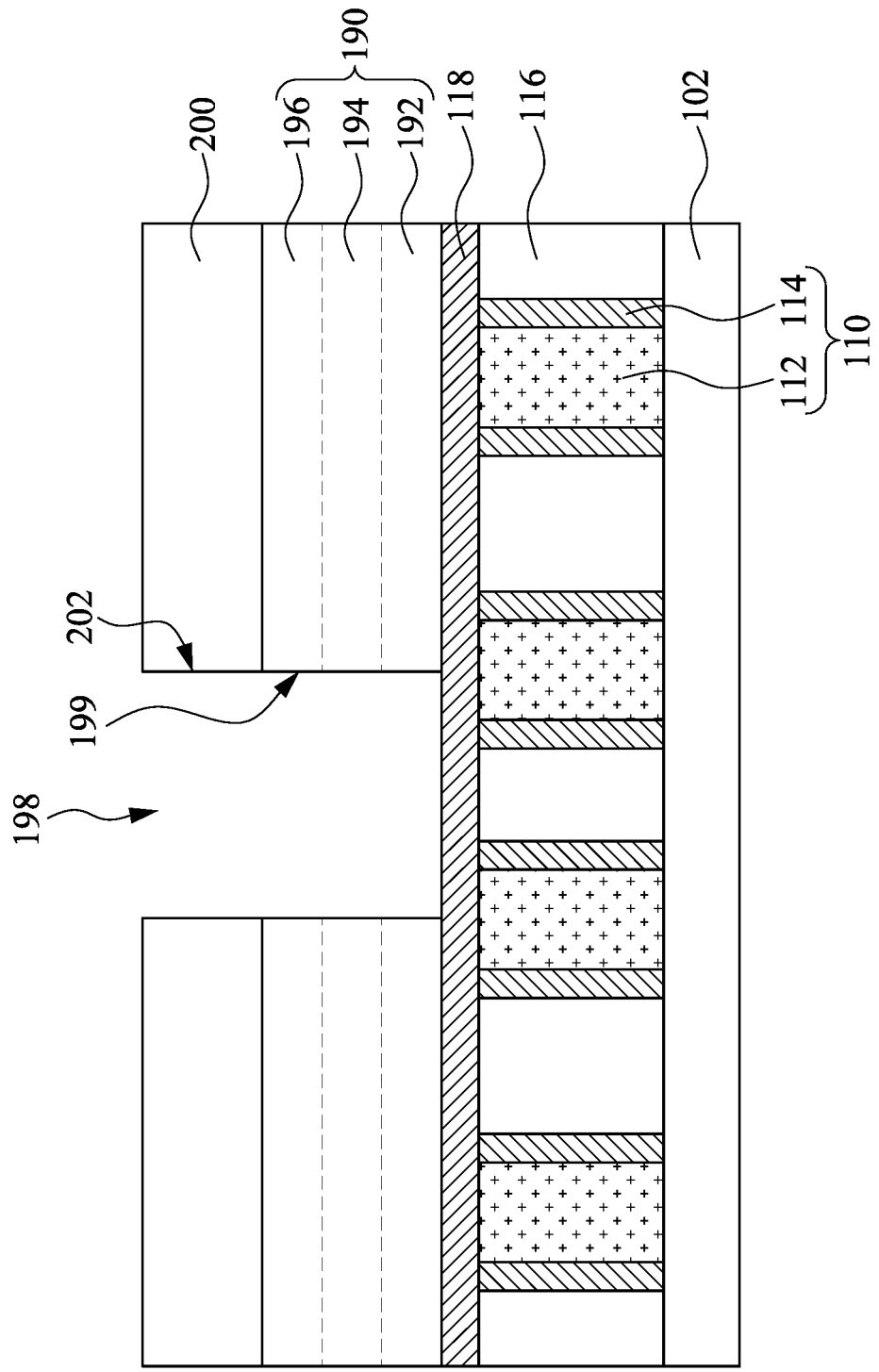
Figure 21:
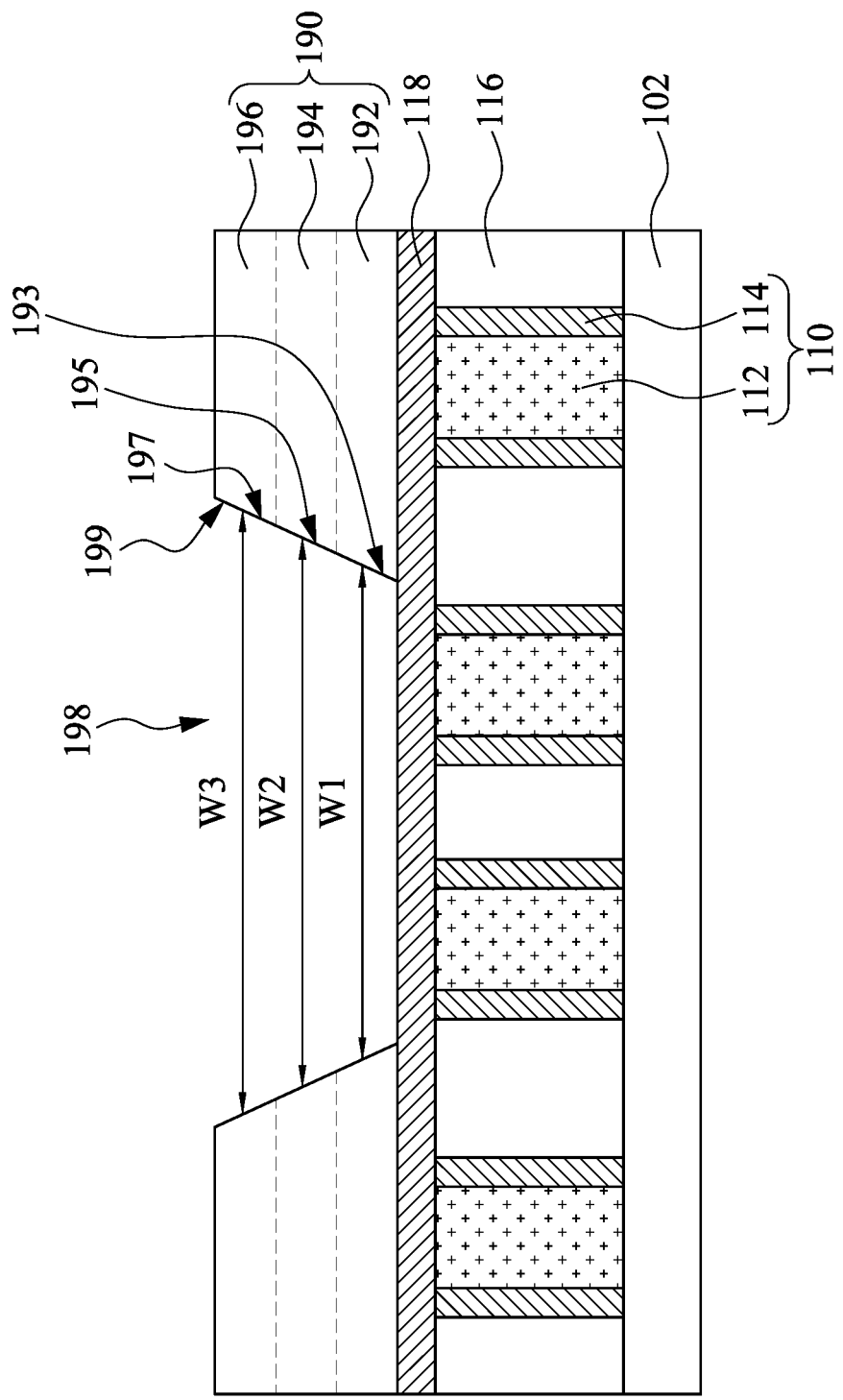

FIGS. 19-21 are cross-sectional views of the method for manufacturing a semiconductor structure in accordance with some embodiments of the present disclosure. In this exemplary embodiment, the operations S120, S130, and S140 mentioned above can be performed respectively as illustrated in FIGS. 19-21.

Reference is made to FIG. 19. A fifth MEOL layer 190 is formed on the etch stop layer 118. In some embodiments, the fifth MEOL layer 190 is made of silicon nitride (SiN), silicon oxycarbide (SiOC), silicon oxycarbonitride (SiOCN), silicon carbonitride (SiCN), silicon (Si), silicon germanium (SiGe), oxide, tungsten (W), titanium nitride (TiN), hafnium dioxide (HfO$_2$), zirconium dioxide (ZrO$_2$), lanthanum oxide (La$_2$O$_3$), or combinations thereof. In some embodiments, the fifth MEOL layer 190 is formed by, for example, PVD, IPVD, ALD, CVD, or combinations thereof. In some embodiments, the fifth MEOL layer 190 has a thickness in a range from about 10 nm to about 100 nm.

Similarly, the fifth MEOL layer 190 may be made of a compound including a first material and a second material, such as silicon nitride (SiN), and a ratio of the first material to the second material may vary with a height from the etch stop layer 118. For example, in this exemplary embodiment, the fifth MEOL layer 190 includes a bottom portion 192, a middle portion 194, and a top portion 196. A ratio of the first material to the second material in the bottom portion 192, a ratio of the first material to the second material in the middle portion 194, and a ratio of the first material to the second material in the top portion 196 are different. Similarly, the different ratios of the first material to the second material in the bottom, central, and top portions 192, 194, and 196 can be achieved by controlling at least one parameter during the formation of the fifth MEOL layer 190.

Since the ratios of the first material to the second material in the bottom, central, and top portions 192, 194, and 196 are different, the bottom, central, and top portions 192, 194, and 196 have different etch resistance properties as well. In some embodiments, etching resistance of the bottom portion 192 to an etchant is greater than that of the middle portion 194, and the etching resistance of the middle portion 194 to the same etchant is greater than that of the top portion 196. In alternative embodiments, the etching resistance of the bottom portion 192 to an etchant is less than that of the middle portion 194, and the etching resistance of the middle portion 194 to the same etchant is less than that of the top portion 196. Accordingly, the fifth MEOL layer 190 has etching resistance to an etchant that varies from the bottom portion 192 to the middle portion 194 and that varies from the middle portion 194 to the top portion 196. For example, the etch resistance of the MEOL layer can gradually increase or decrease from bottom portion 192 to the middle portion 194, and then the etch resistance of the MEOL layer can gradually increase or decrease from the middle portion 194 to the top portion 196 as well.

Reference is made to FIG. 20. A patterned masking layer 200 with at least one opening 202 is formed over the fifth MEOL layer 190. The patterned masking layer 200 may include a photoresist layer, a bottom anti-reflective coating (BARC) layer, amorphous carbon-hydrogen (a-C:H) layers, or combinations thereof, as to serve as a hard mask. In some embodiments, the patterned masking layer 190 has a thickness in a range from about 10 nm to about 100 nm. Then, an etching process is performed to form at least one trench 198 in the fifth MEOL layer 190. The etching process may include wet etching processes or dry etching process such as for example reactive ion etching techniques or plasma etching techniques. The etching process performed on the fifth MEOL layer 190 may be dry etching, such as RIE, ECR, CCP etching, or ICP etching. In some embodiments, the gas etchant used to dry etch the fifth MEOL layer 190 is, for example, $CF_4/O_2$, $ClF_3$, $CCl_3F_5$, $SF_4/O_2$, or combinations thereof. In this exemplary embodiment, after the etching process, the trench 198 is rectangular, and at least one sidewall 199 of the trench 198 is normal to the etch stop layer 118. Furthermore, the etching performed on the fifth MEOL layer 190 may be performed until reaching the etch stop layer 118.

Reference is made to FIG. 21. An etching process is performed on the fifth MEOL layer 190, so as to laterally enlarge the trench 198. The etching process as described in FIG. 20 is referred to as a first etching, and the etching process as described in FIG. 21 is referred to as a second etching. The second etching includes an anisotropic etching, such as RIE, PE etching, or ICP etching. During the second etching which is involved with ion etching, ions are accelerated toward the fifth MEOL layer 190, and the ions generally strike the fifth MEOL layer 190 at an angle of incidence relative to a vector normal to the etch stop layer 118. In some embodiments, the angle is in a range from about −60° to 60°. In some embodiments, plasma gas using in the ion beam etching is $CF_3$, $CF_4$, Ar, $N_2$, $H_2$, He, $SiH_4$, $Si_2H_6$, $CH_4$, $BF_3$, Xe, Ne, $GeH_4$, $PH_3$, or combinations thereof.

During the second etching, the fifth MEOL layer 190 is covered with the patterned masking layer 200 (see FIG. 20), and at least one portion of the fifth MEOL layer 190 exposed from the trench 198 is removed. In this exemplary embodiment, etching resistance of the bottom portion 192 to an etchant used in the second etching is greater than that of the middle portion 194, and the etching resistance of the middle portion 194 to the same etchant used in the second etching is greater than that of the top portion 196. Accordingly, at least one sidewall 199 of the trench 198 is modified to slant to the etch stop layer 118 after the second etching. For example, the removed volume of the bottom portion 192 is less than those of the central and top portions 194 and 196, and the removed volume of the middle portion 194 is less than that of the top portion 196.

In some embodiments, the bottom portion 192 has an opening 193 having a width W1, the middle portion 194 has an opening 195 having a width W2, the top portion 196 has an opening 197 having a width W3, in which the width W3 is greater than the width W2 and the width W2 is greater than the width W1. In this exemplary embodiment, since the width W3 is greater than the width W2 and the width W2 is greater than the width W1, the trench 198 is in an inverted-trapezoid shape. In some embodiments, the width W1 is in a range from about 10 nm to about 70 nm. In some embodiments, the width W2 is in a range from about 10 nm to about 70 nm. In some embodiments, the width W3 is in a range from about 10 nm to about 70 nm.

After the trench 198 is laterally enlarged, the patterned masking layer 200 (see FIG. 20) can be removed from the fifth MEOL layer 190 by, for example, plasma ashing, stripping, or combinations thereof. Plasma ashing uses a plasma source to generate a monatomic reactive species, such as oxygen or fluorine. The reactive species combines with the patterned masking layer 200 to form ash which is removed with a vacuum pump. Stripping uses a photoresist stripper, such as acetone or a phenol solvent, to remove the patterned masking layer 200 from the fifth MEOL layer 190.

In some embodiments, the trench 198 may be in a trapezoid shape by performing the second etching. For example, etching resistance of the bottom portion 192 to an etchant used in the second etching is less than that of the middle portion 194, and the etching resistance of the middle portion 194 to the same etchant used in the second etching is less than that of the top portion 196. Accordingly, the trench 198 can become trapezoid-shaped by performing the second etching. In some embodiments, after the second etching, a filling layer can be formed within the trench 178. For example, FIG. 22 is a cross-sectional view of the method for manufacturing the semiconductor structure in accordance with some embodiments of the present disclosure.

Figure 22:
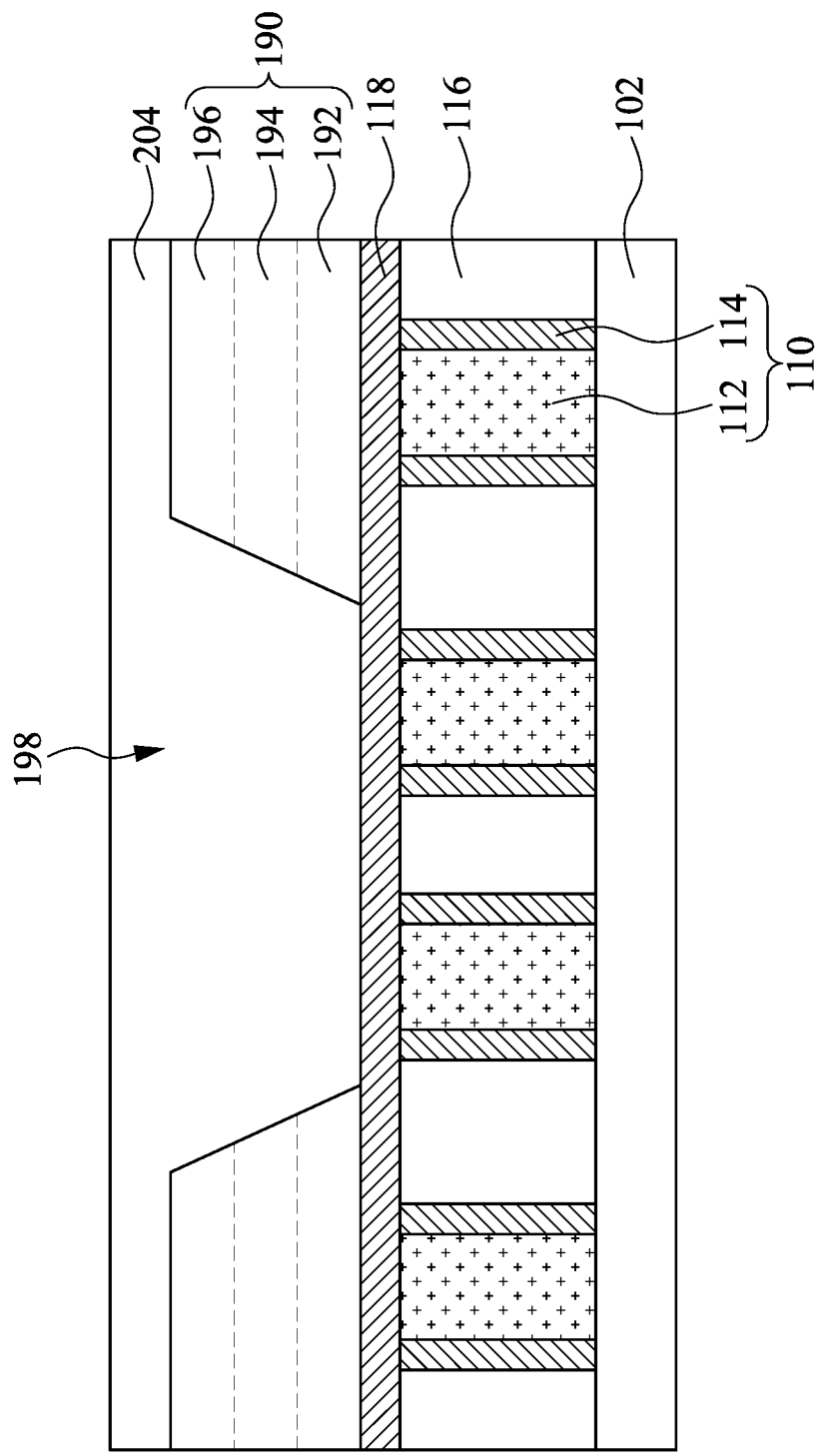
FIG. 22 is a cross-sectional view of the method for manufacturing a semiconductor structure in accordance with some embodiments of the present disclosure.

As shown in FIG. 22, a filling layer 204 is formed over the fifth MEOL layer 190. The trench 198 is filled with a portion of the filling layer 204, and the portion of the filling layer 204 is in contact with the etch stop layer 118. In some embodiments, the filling layer 204 is made of a dielectric material, such as silicon nitride (SiN), silicon oxycarbide (SiOC), silicon oxycarbonitride (SiOCN), silicon carbonitride (SiCN), silicon (Si), silicon germanium (SiGe). In some embodiments, the filling layer 204 is made of a conductive material, such as tungsten (W), titanium nitride (TiN), or combination thereof. In some embodiments, the filling layer 204 is made of an oxide material, such as hafnium dioxide ($HfO_2$), zirconium dioxide ($ZrO_2$), lanthanum oxide ($La_2O_3$), or combinations thereof. In some embodiments, the filling layer 204 is formed by, for example, PVD, IPVD, ALD, CVD, or combinations thereof. In some embodiments, a planarization process, such as a CMP process, is performed on the filling layer 204 until reaching the fifth MEOL layer 190. After the planarization process, the remained filling layer 204 is within the trench 198. In some embodiments, before the formation of the filling layer 204, at least one portion of the etch stop layer 118 which is exposed by the trench 198 is etched to form an opening in the etch stop layer 118. Some portions of the gate structures 110 and the ILD layer 116 are exposed through the opening as described in FIG. 8, and then the filling layer 204 is formed in contact with the exposed portions of the gate structures 110. In some embodiments, after the opening is formed in the etch stop layer 118, the exposed portions of the gate structures 110 and the ILD layer 116 are removed through the opening to form a line-cut as described in FIG. 8, and then the filling layer 204 is formed in contact with the gate structures 110.

Figure 23:
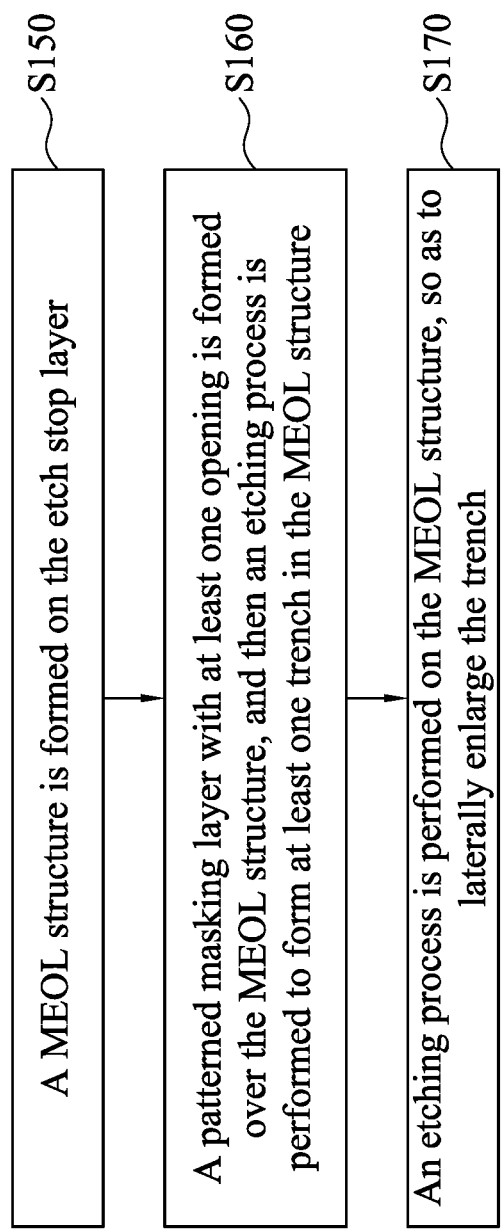
FIG. 23 is a flowchart of operations of a method for manufacturing a semiconductor structure in accordance with some embodiments of the present disclosure.

FIG. 23 is a flowchart of operations S150-170 of a method for manufacturing a semiconductor structure in accordance with some embodiments of the present disclosure. Operations performed before the block S150 are as described in FIGS. 2-3, and hence they are not repeated herein. The method continues with block S150 in which a MEOL structure is formed on the etch stop layer. The method continues with block S160 in which a patterned masking layer with at least one opening is formed over the MEOL structure, and then an etching process is performed to form at least one trench in the MEOL structure. The method continues with block S170 in which an etching process is performed on the MEOL structure, so as to laterally enlarge the trench.

Figure 24:
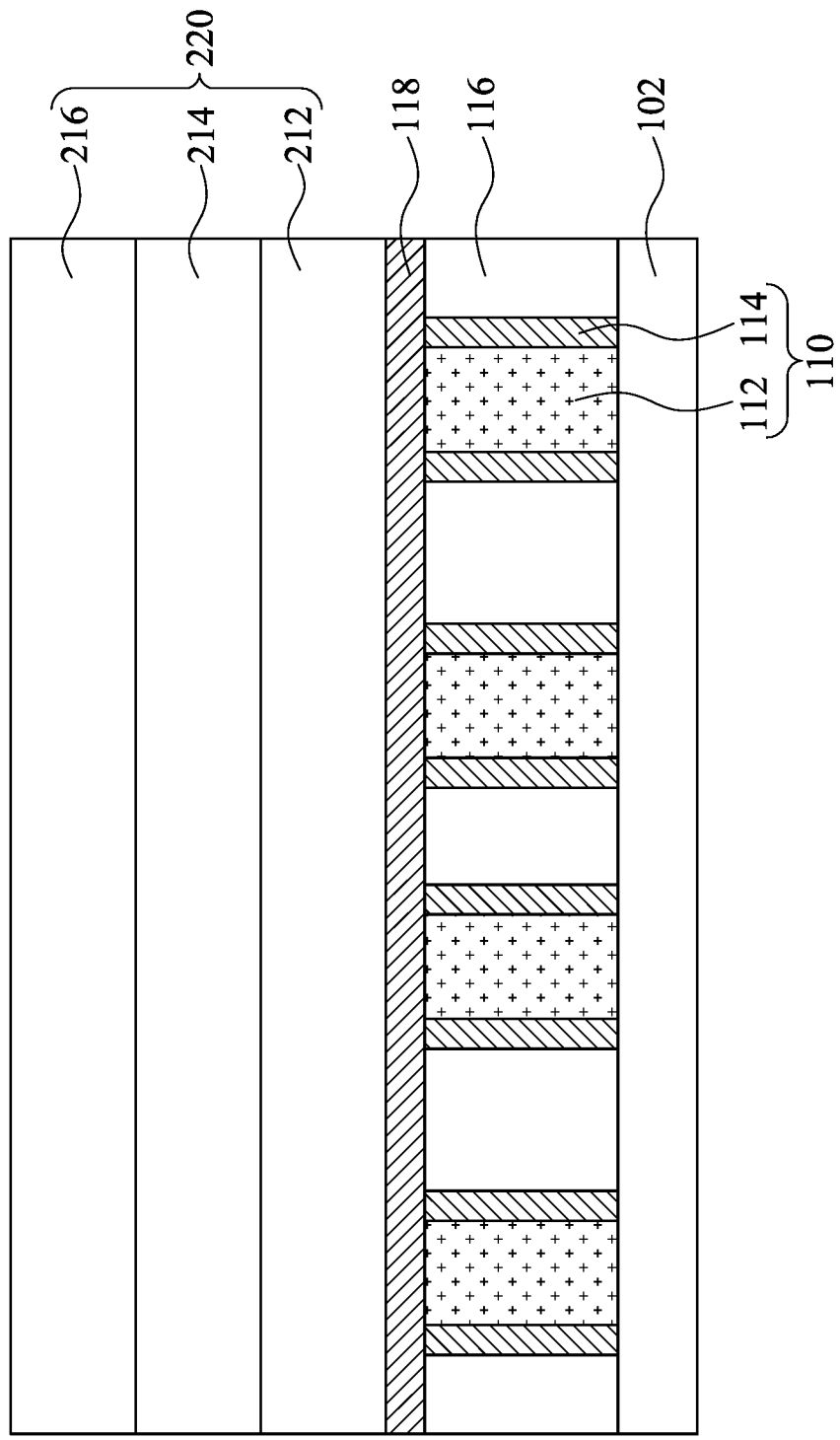
FIGS. 24-26 are cross-sectional views of the method for manufacturing a semiconductor structure in accordance with some embodiments of the present disclosure.
Figure 25:
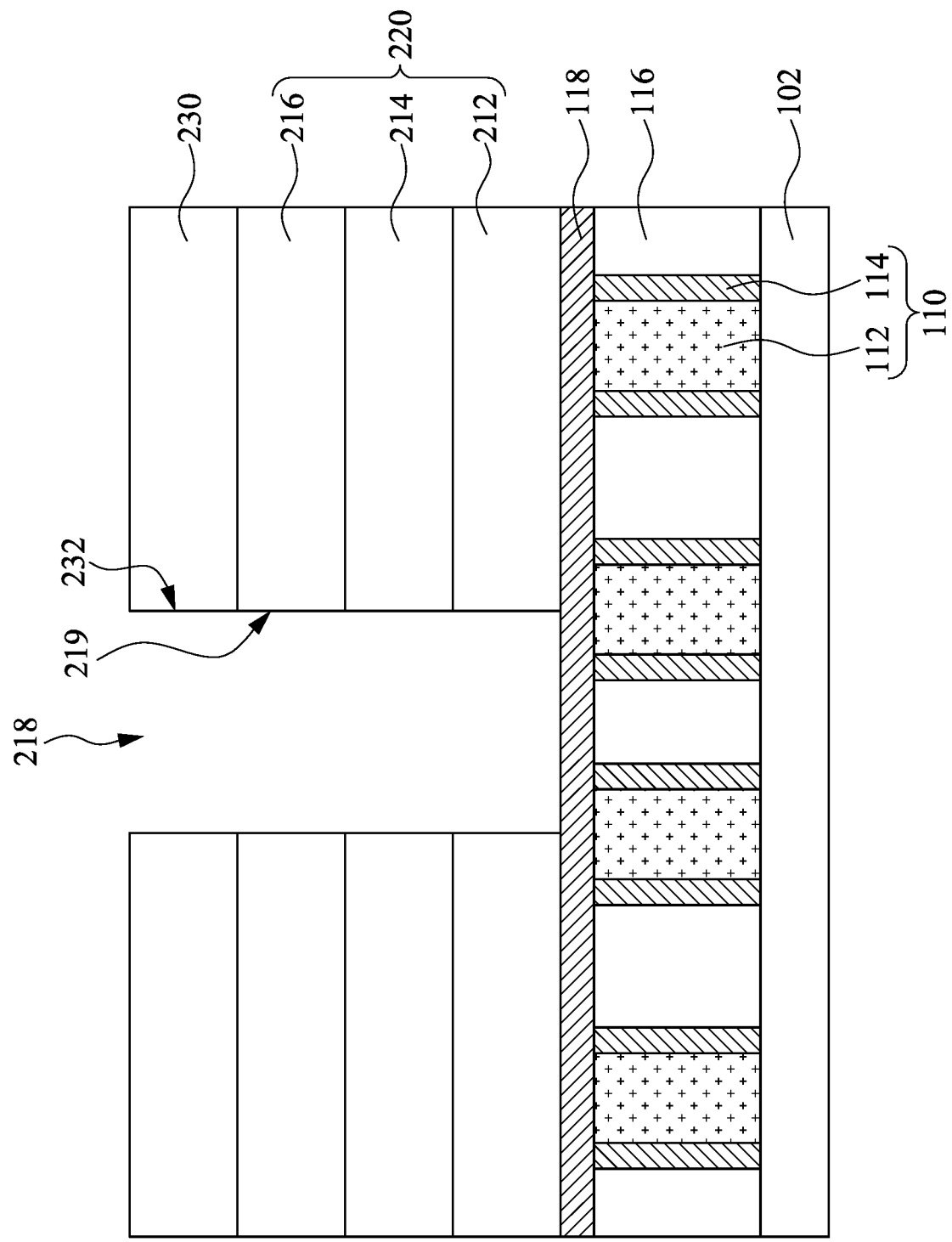
Figure 26:
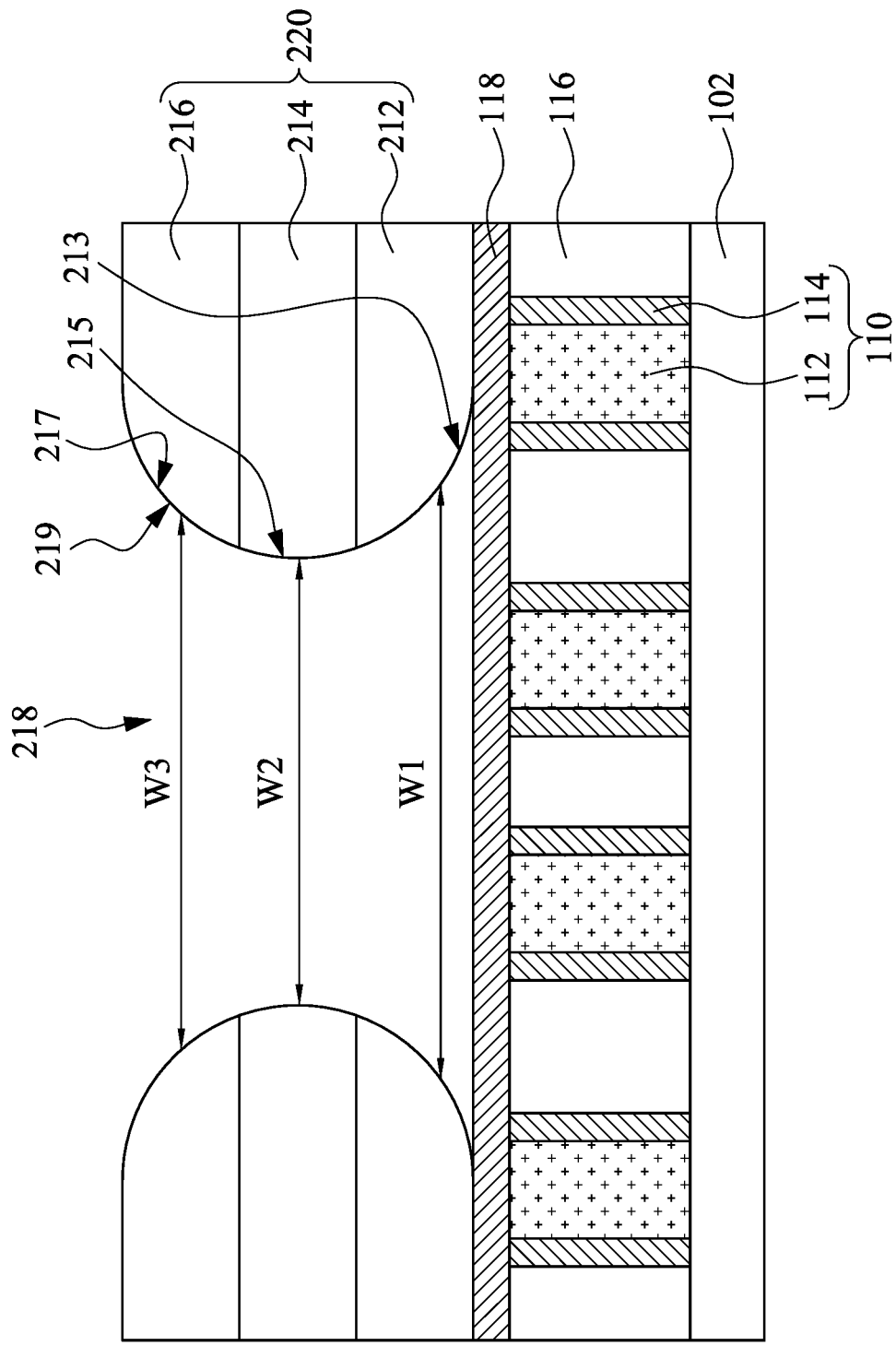

FIGS. 24-26 are cross-sectional views of the method for manufacturing a semiconductor structure in accordance with some embodiments of the present disclosure. In this exemplary embodiment, the operations S150, S160, and S170 mentioned above can be performed respectively as illustrated in FIGS. 24-26.

Reference is made to FIG. 24. A second MEOL structure 220 is formed on the etch stop layer 118, in which the second MEOL structure 220 includes a sixth MEOL layer 212 formed above the etch stop layer 118, a seventh MEOL layer 214 formed above the sixth MEOL layer 212, and an eighth MEOL layer 216 formed above the seventh MEOL layer 214.

In some embodiments, the sixth MEOL layer 212 is made of silicon nitride (SiN), silicon oxycarbide (SiOC), silicon oxycarbonitride (SiOCN), silicon carbonitride (SiCN), silicon (Si), silicon germanium (SiGe), oxide, tungsten (W), titanium nitride (TiN), hafnium dioxide (HfO$_2$), zirconium dioxide (ZrO$_2$), lanthanum oxide (La$_2$O$_3$), or combinations thereof. In some embodiments, the sixth MEOL layer 212 is formed by, for example, PVD, IPVD, ALD, CVD, or combinations thereof. In some embodiments, the sixth MEOL layer 212 has a thickness in a range from about 10 nm to about 100 nm.

In some embodiments, the seventh MEOL layer 214 is made of silicon nitride (SiN), silicon oxycarbide (SiOC), silicon oxycarbonitride (SiOCN), silicon carbonitride (SiCN), silicon (Si), silicon germanium (SiGe), oxide, tungsten (W), titanium nitride (TiN), hafnium dioxide (HfO$_2$), zirconium dioxide (ZrO$_2$), lanthanum oxide (La$_2$O$_3$), or combinations thereof. In some embodiments, the seventh MEOL layer 214 is formed by, for example, PVD, IPVD, ALD, CVD, or combinations thereof. In some embodiments, the seventh MEOL layer 214 has a thickness in a range from about 10 nm to about 100 nm.

In some embodiments, the eighth MEOL layer 216 is made of silicon nitride (SiN), silicon oxycarbide (SiOC), silicon oxycarbonitride (SiOCN), silicon carbonitride (SiCN), silicon (Si), silicon germanium (SiGe), oxide, tungsten (W), titanium nitride (TiN), hafnium dioxide (HfO$_2$), zirconium dioxide (ZrO$_2$), lanthanum oxide (La$_2$O$_3$), or combinations thereof. In some embodiments, the eighth MEOL layer 216 is formed by, for example, PVD, IPVD, ALD, CVD, or combinations thereof. In some embodiments, the eighth MEOL layer 216 has a thickness in a range from about 10 nm to about 100 nm.

In some embodiments, by making the sixth, seventh, and eighth MEOL layers 212, 214, and 216 have different physical or chemical properties, the sixth, seventh, and eighth MEOL layers 212, 214, and 216 may have different etch resistance properties or different density properties.

In some embodiments, the sixth, seventh, and eighth MEOL layers 212, 214, and 216 may be made of different materials, respectively, such that the etch resistance properties of the sixth, seventh, and eighth MEOL layers 212, 214, and 216 are different. In some embodiments, the sixth, seventh, and eighth MEOL layers 212, 214, and 216 may be made of the same material and be formed with different processes, respectively, such that the etch resistance properties of the sixth, seventh, and eighth MEOL layers 212, 214, and 216 are different. For example, the different deposition processes may be used for forming the sixth and seventh MEOL layers 212 and 214. In some embodiments, the sixth, seventh, and eighth MEOL layers 212, 214, and 216 may be made of the same material and formed by the same process with different process recipes, respectively, such that the etch resistance properties of the sixth, seventh, and eighth MEOL layers 212, 214, and 216 are different.

Etching resistance of the seventh MEOL layer 214 to an etchant may be different from those of the sixth and eighth MEOL layers 212 and 216. In some embodiments, the etching resistance of the seventh MEOL layer 214 to an etchant is greater than those of the sixth and eighth MEOL layers 212 and 216. In some embodiments, the etching resistance of the seventh MEOL layer 214 to an etchant is less than those of the sixth and eighth MEOL layers 212 and 216. In some embodiments, the etching resistance of the sixth MEOL layer 212 to etchant is the same as that of the eighth MEOL layer 216.

In some embodiments, the sixth, seventh, and eighth MEOL layers 212, 214, and 216 may be made of different materials, respectively, such that one of the sixth, seventh, and eighth MEOL layers 212, 214, and 216 has different density from that of another one of the sixth, seventh, and eighth MEOL layers 212, 214, and 216. In some embodiments, the sixth, seventh, and eighth MEOL layers 212, 214, and 216 may be made of the same material and be formed with different processes, respectively, such that one of the sixth, seventh, and eighth MEOL layers 212, 214, and 216 has different density from that of another one of the sixth, seventh, and eighth MEOL layers 212, 214, and 216. In some embodiments, the sixth, seventh, and eighth MEOL layers 212, 214, and 216 may be made of the same material and formed by the same process with different process recipes, respectively, such that one of the sixth, seventh, and eighth MEOL layers 212, 214, and 216 has different density from that of another one of the sixth, seventh, and eighth MEOL layers 212, 214, and 216.

Reference is made to FIG. 25. A patterned masking layer 230 with at least one opening 232 is formed over the second MEOL structure 220. The patterned masking layer 230 may include a photoresist layer, a bottom anti-reflective coating (BARC) layer, amorphous carbon-hydrogen (a-C:H) layers, or combinations thereof, as to serve as a hard mask. In some embodiments, the patterned masking layer 230 has a thickness in a range from about 10 nm to about 100 nm. Then, an etching process is performed to form at least one trench 218 in the second MEOL structure 220. The etching process may include wet etching processes or dry etching process such as for example reactive ion etching techniques or plasma etching techniques. The etching process performed on the second MEOL structure 220 may be dry etching, such as RIE, ECR, CCP etching, or ICP etching. In some embodiments, the gas etchant used to dry etch the second MEOL structure 220 is, for example, CF$_4$/O$_2$, ClF$_3$, CCl$_3$F$_5$, SF$_4$/O2, or combinations thereof. In this exemplary embodiment, after the etching process, the trench 218 is rectangular, and at least one sidewall 219 of the trench 218 is normal to the etch stop layer 118. Furthermore, the etching performed on the second MEOL structure 220 may be performed until reaching the etch stop layer 118.

Reference is made to FIG. 26. An etching process is performed on the second MEOL structure 220, so as to laterally enlarge the trench 218. The etching process as described in FIG. 26 is referred to as a first etching, and the etching process as described in FIG. 25 is referred to as a second etching. The second etching includes an anisotropic etching, such as RIE, PE etching, or ICP etching. During the second etching which is involved with ion etching, ions are accelerated toward the second MEOL structure 220, and the ions generally strike the second MEOL structure 220 at an angle of incidence relative to a vector normal to the etch stop layer 118. In some embodiments, the angle is in a range from about −60° to 60°. In some embodiments, plasma gas using in the ion beam etching is CF$_3$, CF$_4$, Ar, N$_2$, H$_2$, He, SiH$_4$, Si$_2$H$_6$, CH$_4$, BF$_3$, Xe, Ne, GeH$_4$, PH$_3$, or combinations thereof.

During the second etching, the second MEOL structure 220 is covered with the patterned masking layer 230 (see FIG. 25), and the some portions of the second MEOL structure 220 exposed from the trench 218 are removed. In this exemplary embodiment, etching resistance of the seventh MEOL layer 214 to an etchant used in the second etching is greater than those of the sixth and eighth MEOL layers 212 and 216. Accordingly, since the etching resistance of the seventh MEOL layer 214 is greater than those of the sixth and eighth MEOL layers 212 and 216, the sidewall 219 of the trench 218 is modified to become curved after the second etching. For example, the removed portion of the seventh MEOL layer 214 is less than those of the sixth and eighth MEOL layers 212 and 216.

In some embodiments, the sixth MEOL layer 212 has an opening 213 having a width W1, the seventh MEOL layer 214 has an opening 215 having a width W2, the eighth MEOL layer 216 has an opening 217 having a width W3, in which the width W2 is less than the widths W1 and W3. In some embodiments, the width W1 of the opening 213 is the same as the width W3 of the opening 217. In this exemplary embodiment, since the opening 215 of the seventh MEOL layer 214 has the width W2 less than those of the openings 213 and 217 of the sixth and eighth MEOL layers 212 and 216, the second MEOL structure 220 is convex toward the trench 218. In some embodiments, the width W1 is in a range from about 10 nm to about 70 nm. In some embodiments, the width W2 is in a range from about 10 nm to about 70 nm. In some embodiments, the width W3 is in a range from about 10 nm to about 70 nm.

After the trench 218 is laterally enlarged, the patterned masking layer 230 (see FIG. 25) can be removed from the second MEOL structure 220 by, for example, plasma ashing, stripping, or combinations thereof. Plasma ashing uses a plasma source to generate a monatomic reactive species, such as oxygen or fluorine. The reactive species combines with the patterned masking layer 230 to form ash which is removed with a vacuum pump. Stripping uses a photoresist stripper, such as acetone or a phenol solvent, to remove the patterned masking layer 230 from the second MEOL structure 220.

In some embodiments, the second MEOL structure 220 may be etched to become concave from the trench 218. For example, etching resistance of the seventh MEOL layer 214 to an etchant used in the second etching is less than those of the sixth and eighth MEOL layers 212 and 216, and therefore the second MEOL structure 220 can be concave from the trench 218 after the second etching. In some embodiments, after the second etching, a filling layer can be formed within the trench 218. For example, FIG. 27 is a cross-sectional view of the method for manufacturing the semiconductor structure in accordance with some embodiments of the present disclosure.

Figure 27:
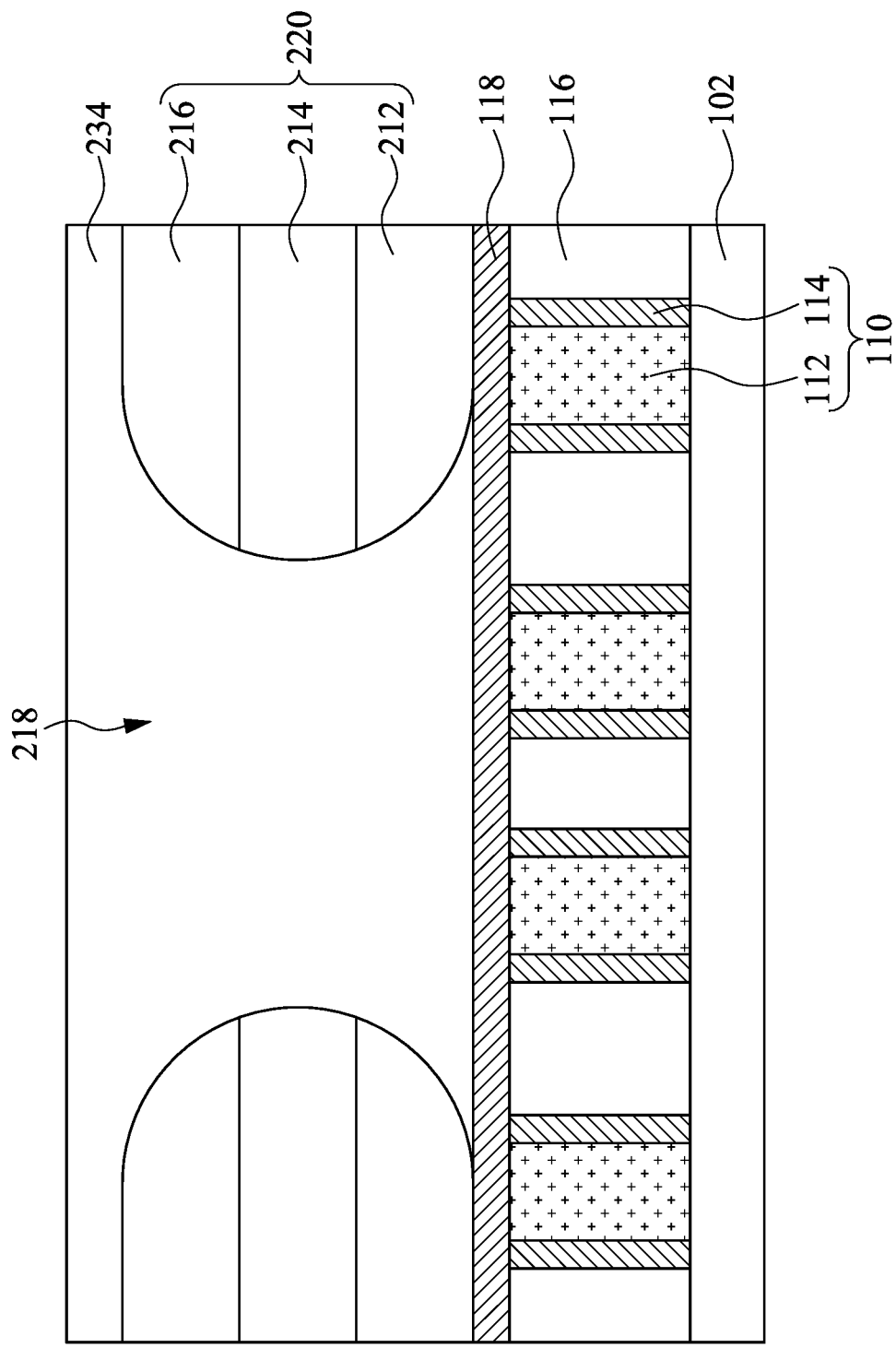
FIG. 27 is a cross-sectional views of the method for manufacturing a semiconductor structure in accordance with some embodiments of the present disclosure.

As shown in FIG. 27, a filling layer 234 is formed over the fifth MEOL layer 190. The trench 198 is filled with a portion of the filling layer 234, and the portion of the filling layer 234 is in contact with the etch stop layer 118. In some embodiments, the filling layer 234 is made of a dielectric material, such as silicon nitride (SiN), silicon oxycarbide (SiOC), silicon oxycarbonitride (SiOCN), silicon carbonitride (SiCN), silicon (Si), silicon germanium (SiGe). In some embodiments, the filling layer 234 is made of a conductive material, such as tungsten (W), titanium nitride (TiN), or combination thereof. In some embodiments, the filling layer 234 is made of an oxide material, such as hafnium dioxide ($HfO_2$), zirconium dioxide ($ZrO_2$), lanthanum oxide ($La_2O_3$), or combinations thereof. In some embodiments, the filling layer 234 is formed by, for example, PVD, IPVD, ALD, CVD, or combinations thereof. In some embodiments, a planarization process, such as a CMP process, is performed on the filling layer 234 until reaching the fifth MEOL layer 190. After the planarization process, the remained filling layer 234 is within the trench 198. In some embodiments, before the formation of the filling layer 234, at least one portion of the etch stop layer 118 which is exposed by the trench 198 is etched to form an opening in the etch stop layer 118. Some portions of the gate structures 110 and the ILD layer 116 are exposed through the opening as described in FIG. 8, and then the filling layer 234 is formed in contact with the exposed portions of the gate structures 110. In some embodiments, after the opening is formed in the etch stop layer 118, the exposed portions of the gate structures 110 and the ILD layer 116 are removed through the opening to form a line-cut as described in FIG. 8, and then the filling layer 234 is formed in contact with the gate structures 110.

Figure 28:
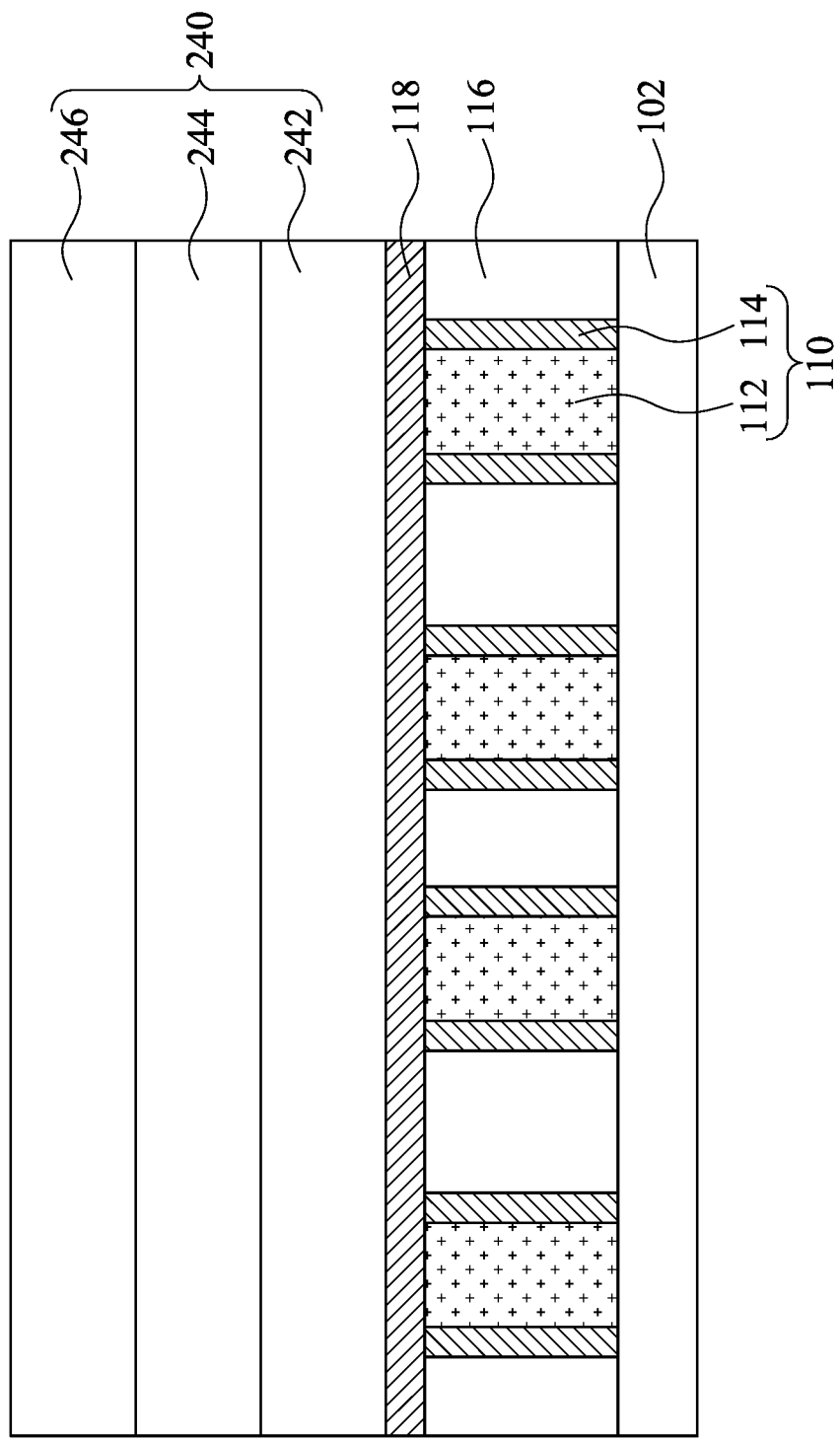
FIGS. 28-30 are cross-sectional views of the method for manufacturing a semiconductor structure in accordance with some embodiments of the present disclosure.
Figure 29:
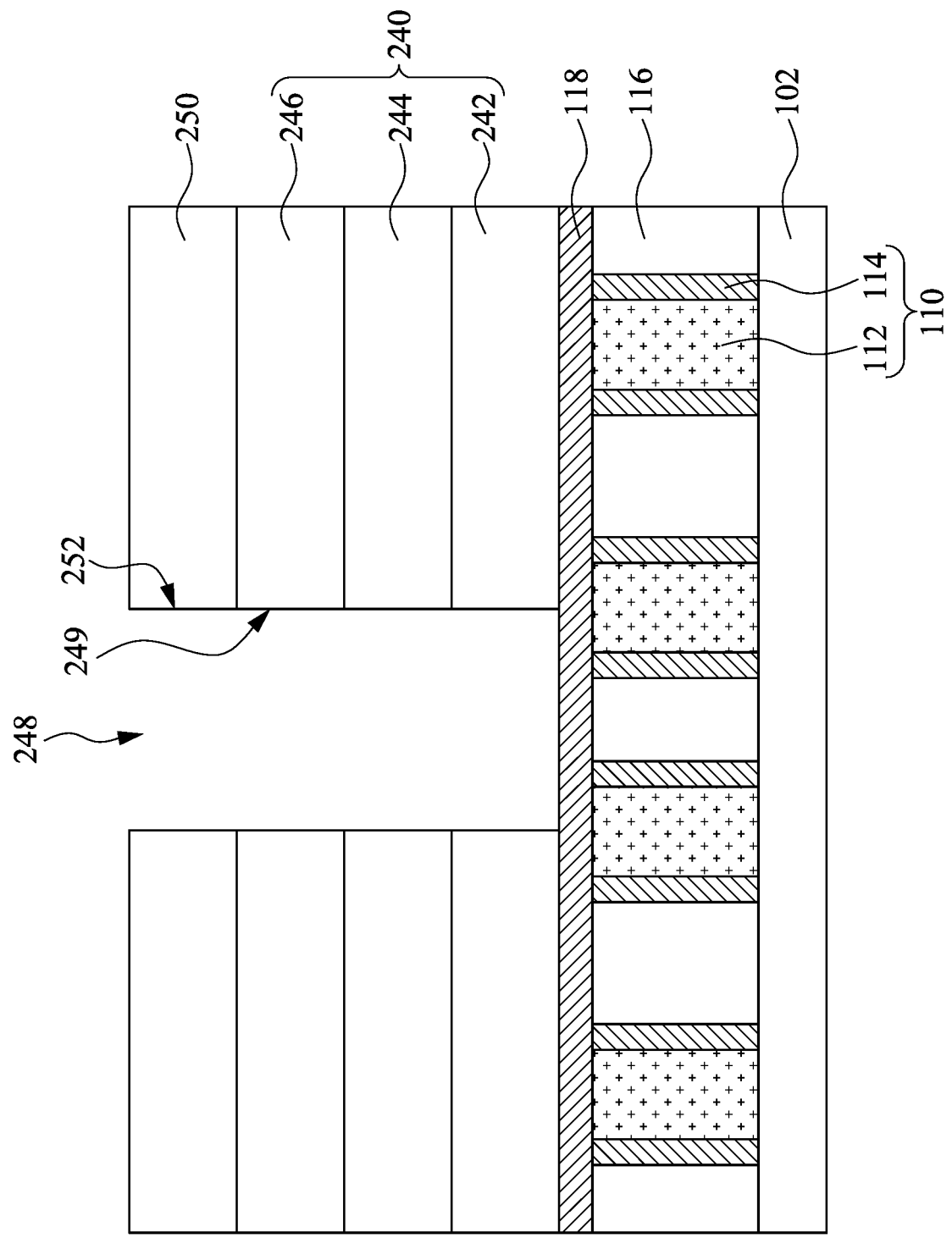
Figure 30:
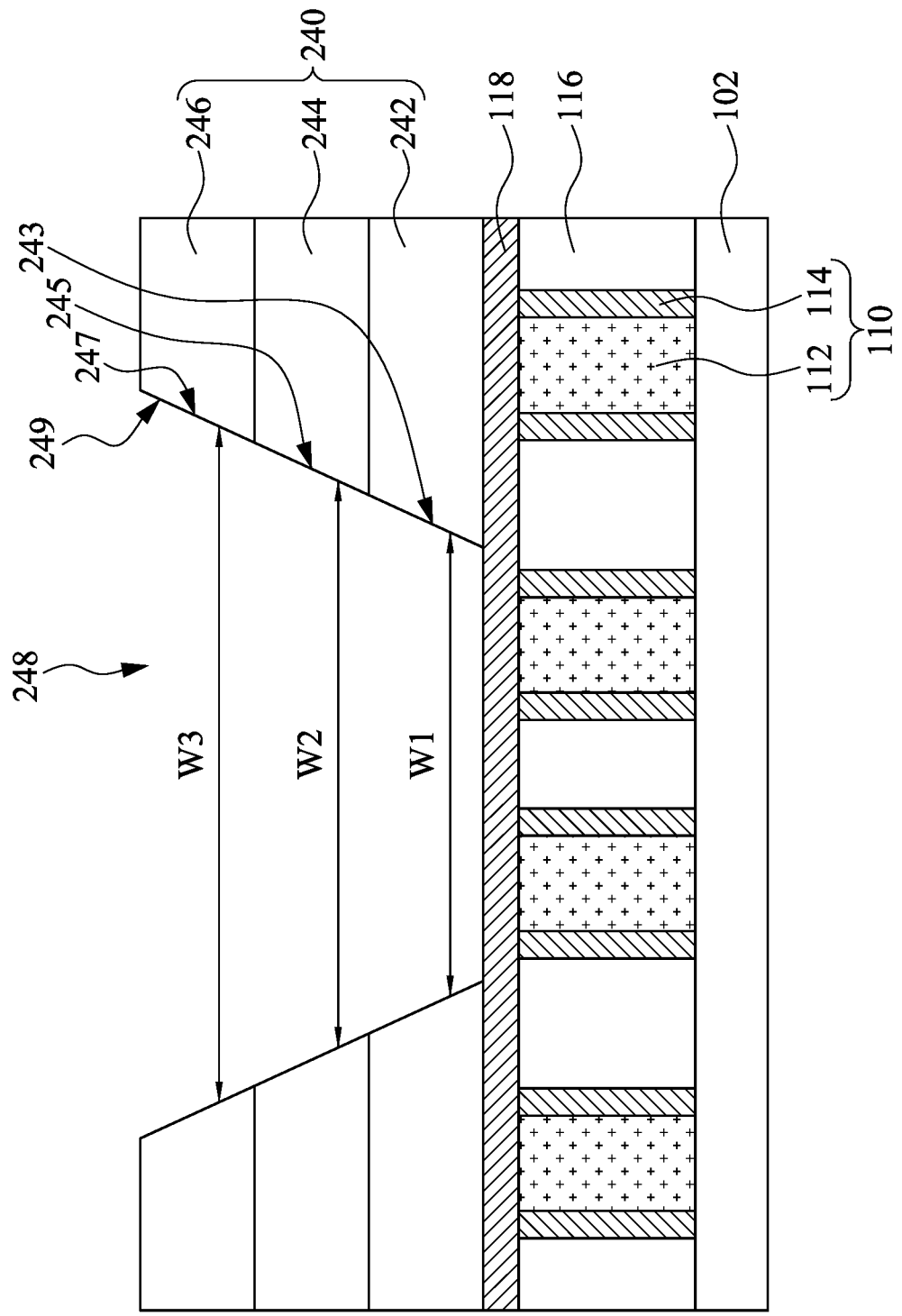

FIGS. 28-30 are cross-sectional views of the method for manufacturing a semiconductor structure in accordance with some embodiments of the present disclosure. In this exemplary embodiment, the operations S120, S130, and S140 mentioned above can be performed respectively as illustrated in FIGS. 28-30.

Reference is made to FIG. 28. A third MEOL structure 240 is formed on the etch stop layer 118, in which the third MEOL structure 240 includes a ninth MEOL layer 242 formed above the etch stop layer 118, a tenth MEOL layer 244 formed above the ninth MEOL layer 242, and an eleventh MEOL layer 246 formed above the tenth MEOL layer 244.

In some embodiments, the ninth MEOL layer 242 is made of silicon nitride (SiN), silicon oxycarbide (SiOC), silicon oxycarbonitride (SiOCN), silicon carbonitride (SiCN), silicon (Si), silicon germanium (SiGe), oxide, tungsten (W), titanium nitride (TiN), hafnium dioxide ($HfO_2$), zirconium dioxide ($ZrO_2$), lanthanum oxide ($La_2O_3$), or combinations thereof. In some embodiments, the ninth MEOL layer 242 is formed by, for example, PVD, IPVD, ALD, CVD, or combinations thereof. In some embodiments, the ninth MEOL layer 242 has a thickness in a range from about 10 nm to about 100 nm.

In some embodiments, the tenth MEOL layer 244 is made of silicon nitride (SiN), silicon oxycarbide (SiOC), silicon oxycarbonitride (SiOCN), silicon carbonitride (SiCN), silicon (Si), silicon germanium (SiGe), oxide, tungsten (W), titanium nitride (TiN), hafnium dioxide ($HfO_2$), zirconium dioxide ($ZrO_2$), lanthanum oxide ($La_2O_3$), or combinations thereof. In some embodiments, the tenth MEOL layer 244 is formed by, for example, PVD, IPVD, ALD, CVD, or combinations thereof. In some embodiments, the tenth MEOL layer 244 has a thickness in a range from about 10 nm to about 100 nm.

In some embodiments, the eleventh MEOL layer 246 is made of silicon nitride (SiN), silicon oxycarbide (SiOC), silicon oxycarbonitride (SiOCN), silicon carbonitride (SiCN), silicon (Si), silicon germanium (SiGe), oxide, tungsten (W), titanium nitride (TiN), hafnium dioxide ($HfO_2$), zirconium dioxide ($ZrO_2$), lanthanum oxide ($La_2O_3$), or combinations thereof. In some embodiments, the eleventh MEOL layer 246 is formed by, for example, PVD, IPVD, ALD, CVD, or combinations thereof. In some embodiments, the eleventh MEOL layer 246 has a thickness in a range from about 10 nm to about 100 nm.

Similarly, by making the ninth, tenth, and eleventh MEOL layers 242, 244, and 246 have different physical or chemical properties, the ninth, tenth, and eleventh MEOL layers 242, 244, and 246 may have different etch resistance properties or different density properties.

In some embodiments, etching resistance of the ninth MEOL layer 242 to an etchant is greater than that of the tenth MEOL layer 244, and the etching resistance of the tenth MEOL layer 244 to the same etchant is greater than that of the eleventh MEOL layer 246. In alternative embodiments, etching resistance of the ninth MEOL layer 242 to an etchant is less than that of the tenth MEOL layer 244, and the etching resistance of the tenth MEOL layer 244 to the same etchant is less than that of the eleventh MEOL layer 246.

In some embodiments, the ninth MEOL layer 242 has lower density than that of the tenth MEOL layer 244, and the density of the tenth MEOL layer 244 is lower than that of the eleventh MEOL layer 246. In alternative embodiments, the ninth MEOL layer 242 has higher density than that of the tenth MEOL layer 244, and the density of the tenth MEOL layer 244 is higher than that of the eleventh MEOL layer 246.

Reference is made to FIG. 29. A patterned masking layer 250 with at least one opening 252 is formed over the third MEOL structure 240. The patterned masking layer 250 may include a photoresist layer, a bottom anti-reflective coating (BARC) layer, amorphous carbon-hydrogen (a-C:H) layers, or combinations thereof, as to serve as a hard mask. In some embodiments, the patterned masking layer 250 has a thickness in a range from about 10 nm to about 100 nm. Then, an etching process is performed to form at least one trench 248 in the third MEOL structure 240. The etching process may include wet etching processes or dry etching process such as for example reactive ion etching techniques or plasma etching techniques. The etching process may be dry etching, such as RIE, ECR, CCP etching, or ICP etching. In some embodiments, the gas etchant used to dry etch the third MEOL structure 240 is, for example, $CF_4/O_2$, $ClF_3$, $CCl_3F_5$, $SF_4/O_2$, or combinations thereof. In this exemplary embodiment, after the etching process, the trench 248 is rectangular, and at least one sidewall 249 of the trench 248 is normal to the etch stop layer 118. Furthermore, the etching performed on the third MEOL structure 240 may be performed until reaching the etch stop layer 118.

Reference is made to FIG. 30. An etching process is performed on the third MEOL structure 240, so as to laterally enlarge the trench 248. The etching process as described in FIG. 29 is referred to as a first etching, and the etching process as described in FIG. 30 is referred to as a second etching. The second etching includes an anisotropic etching, such as RIE, PE etching, or ICP etching. During the second etching which is involved with ion etching, ions are accelerated toward the third MEOL structure 240, and the ions generally strike the third MEOL structure 240 at an angle of incidence relative to a vector normal to the etch stop layer 118. In some embodiments, the angle is in a range from about −60° to 60°. In some embodiments, plasma gas using in the ion beam etching is $CF_3$, $CF_4$, Ar, $N_2$, $H_2$, He, $SiH_4$, $Si_2H_6$, $CH_4$, $BF_3$, Xe, Ne, $GeH_4$, $PH_3$, or combinations thereof.

During the second etching, the third MEOL structure 240 is covered with the patterned masking layer 250 (see FIG. 29), and some portions of the third MEOL structure 240 exposed from the trench 248 are removed. In this exemplary embodiment, etching resistance of the ninth MEOL layer 242 to an etchant used in the second etching is greater than that of the tenth MEOL layer 244, and the etching resistance of the tenth MEOL layer 244 to the same etchant used in the second etching is greater than that of the eleventh MEOL layer 246. Accordingly, the sidewall 249 of the trench 248 is modified to slant to the etch stop layer 118 after the second etching. For example, the removed portion of the ninth MEOL layer 242 is less than those of the tenth and eleventh MEOL layers 244 and 246, and the removed volume of the tenth MEOL layer 244 is less than that of the eleventh MEOL layer 246.

In some embodiments, the ninth MEOL layer 242 has an opening 243 having a width W1, the tenth MEOL layer 244 has an opening 245 having a width W2, the eleventh MEOL layer 246 has an opening 247 having a width W3, in which the width W3 is greater than the width W2 and the width W2 is greater than the width W1. In this exemplary embodiment, since the width W3 is greater than the width W2 and the width W2 is greater than the width W1, the trench 248 is in an inverted-trapezoid shape. In some embodiments, the width W1 is in a range from about 10 nm to about 70 nm. In some embodiments, the width W2 is in a range from about 10 nm to about 70 nm. In some embodiments, the width W3 is in a range from about 10 nm to about 70 nm.

After the trench 248 is laterally enlarged, the patterned masking layer 250 (see FIG. 29) can be removed from the third MEOL structure 240 by, for example, plasma ashing, stripping, or combinations thereof. Plasma ashing uses a plasma source to generate a monatomic reactive species, such as oxygen or fluorine. The reactive species combines with the patterned masking layer 250 to form ash which is removed with a vacuum pump. Stripping uses a photoresist stripper, such as acetone or a phenol solvent, to remove the patterned masking layer 250 from the third MEOL structure 240.

In other embodiments, the trench 248 may be in a trapezoid shape by performing the second etching. For example, in some embodiments, etching resistance of the ninth MEOL layer 242 to an etchant used in the second etching is less than that of the tenth MEOL layer 244, and the etching resistance of the tenth MEOL layer 244 to the same etchant used in the second etching is less than that of the eleventh MEOL layer 246. Accordingly, after the second etching, the trench 248 may become trapezoid-shaped. In some embodiments, after the second etching, a filling layer can be formed within the trench 248. For example, FIG. 31 is a cross-sectional view of the method for manufacturing the semiconductor structure in accordance with some embodiments of the present disclosure.

Figure 31:
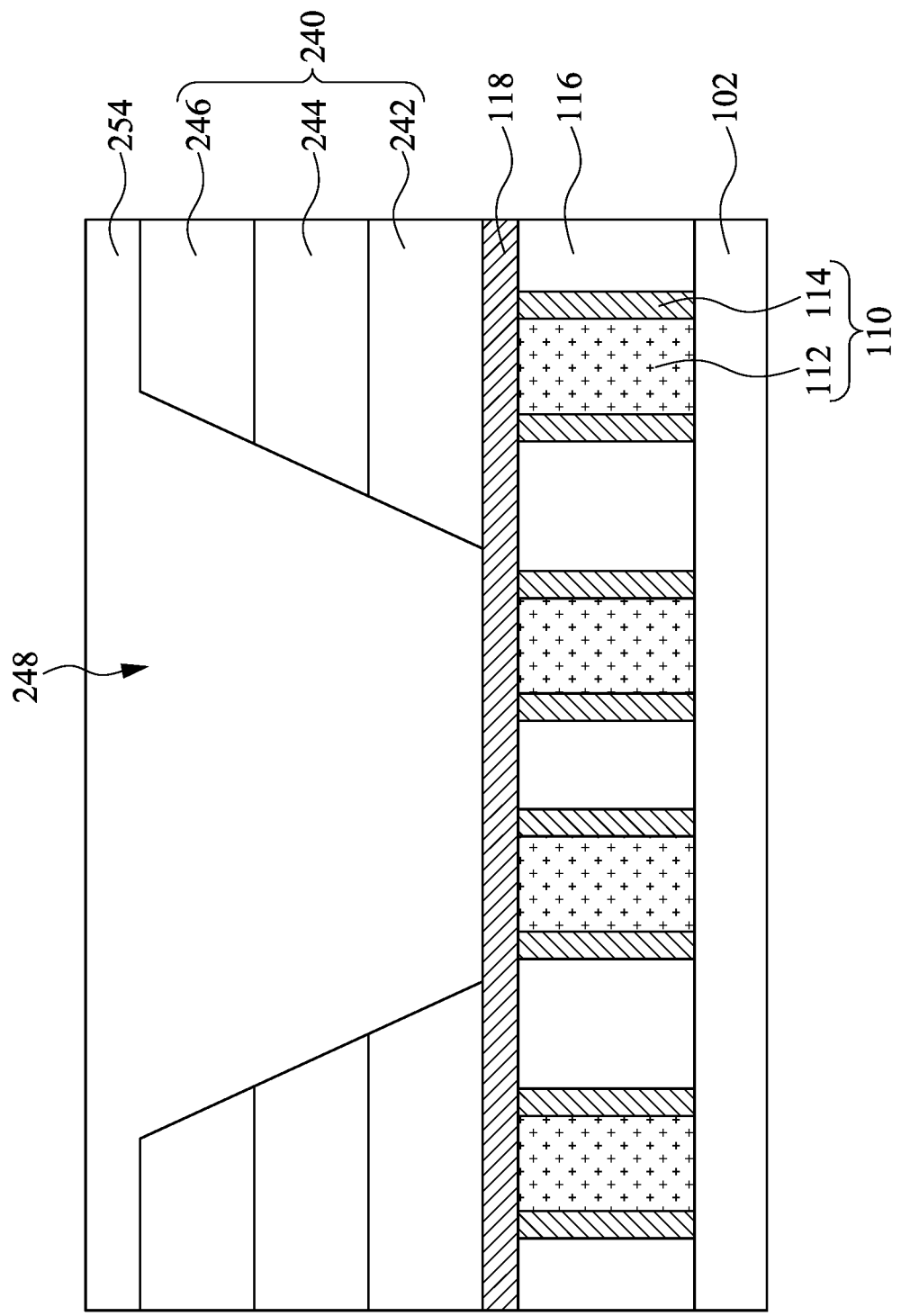
FIG. 31 is a cross-sectional views of the method for manufacturing a semiconductor structure in accordance with some embodiments of the present disclosure.

As shown in FIG. 31, a filling layer 254 is formed over the third MEOL structure 240. The trench 248 is filled with a portion of the filling layer 254, and the portion of the filling layer 254 is in contact with the etch stop layer 118. In some embodiments, the filling layer 254 is made of a dielectric material, such as silicon nitride (SiN), silicon oxycarbide (SiOC), silicon oxycarbonitride (SiOCN), silicon carbonitride (SiCN), silicon (Si), silicon germanium (SiGe). In some embodiments, the filling layer 254 is made of a conductive material, such as tungsten (W), titanium nitride (TiN), or combination thereof. In some embodiments, the filling layer 254 is made of an oxide material, such as hafnium dioxide ($HfO_2$), zirconium dioxide ($ZrO_2$), lanthanum oxide ($La_2O_3$), or combinations thereof. In some embodiments, the filling layer 254 is formed by, for example, PVD, IPVD, ALD, CVD, or combinations thereof. In some embodiments, a planarization process, such as a CMP process, is performed on the filling layer 254 until reaching the third MEOL structure 240. After the planarization process, the remained filling layer 254 is within the trench 248. In some embodiments, before the formation of the filling layer 254, at least one portion of the etch stop layer 118 which is exposed by the trench 248 is etched to form an opening in the etch stop layer 118. Some portions of the gate structures 110 and the ILD layer 116 are exposed through the opening as described in FIG. 8, and then the filling layer 254 is formed in contact with the exposed portions of the gate structures 110. In some embodiments, after the opening is formed in the etch stop layer 118, the exposed portions of the gate structures 110 and the ILD layer 116 are removed through the opening to form a line-cut as described in FIG. 8, and then the filling layer 254 is formed in contact with the gate structures 110.

As described above, the semiconductor structure includes one or more MEOL layers, and at least one trench can be formed in the one or more MEOL layers by a first etching process. After the trench is formed, a second etching process can be performed to laterally enlarge the trench. Furthermore, with the second etching process, a profile of at least one sidewall of the trench can be adjusted. The one or more MEOL layers may have more than one etch resistance property, such that the sidewall of the trench can become curved or inverted-trapezoid shaped.

According to various embodiments of the present disclosure, a method for manufacturing a semiconductor structure is provided. The method includes following steps. A MEOL structure is formed on an etch stop layer. A patterned masking layer with at least one opening is formed on the MEOL structure and a first etching process is performed to form a trench in the MEOL structure. A second etching process is performed to modify at least one sidewall of the trench.

In some embodiments, the second etching process comprises an anisotropic etching process performed by using ions to strike the MEOL structure through the trench.

In some embodiments, the trench is changed from a rectangular shape to an inverted-trapezoid shape by performing the second etching process.

In some embodiments, the sidewall of the trench becomes curved by performing the second etching process.

In some embodiments, the sidewall of the trench slants to the etch stop layer after the second etching process.

In some embodiments, the forming the MEOL structure comprises forming a first MEOL layer and a second MEOL layer which are made of the same material. The first and second MEOL layers are formed by different recipes, such that the first MEOL layer has an etch resistance property which is different from that of the second MEOL layer.

In some embodiments, the forming the MEOL structure comprises forming a first MEOL layer and a second MEOL layer which are made of different materials, such that the first MEOL layer has an etch resistance property which is different from that of the second MEOL layer.

In some embodiments, the forming the MEOL structure comprises forming a MEOL layer by using different precursors, such that a ratio of a first material to a second material in a bottom portion of the MEOL layer is different from that in a middle portion of the MEOL layer.

In some embodiments, the method further comprises following steps. An ILD layer and a plurality of gate structures are formed on a semiconductor substrate, in which the etch stop layer is formed on the ILD layer and the gate structures. At least one portion of the etch stop layer is removed to expose some portions of the ILD layer and the gate structures after the second etching process. The exposed portion of the gate structures are removed to form a line-cut.

According to various embodiments of the present disclosure, a method for manufacturing a semiconductor structure is provided. The method includes following steps. A MEOL structure is formed on an etch stop layer. A first etching process is performed to the MEOL structure until reaching the etch stop layer, so as to form a trench in the MEOL structure. A second etching process is performed to laterally enlarge the trench.

In some embodiments, a width of the trench varies from an inlet of the trench to a bottom of the trench after the second etching process.

In some embodiments, the method further comprises following steps. A patterned masking layer with at least one opening is formed on the MEOL structure, in which the forming the patterned masking layer is prior to the first etching process. The patterned masking layer is removed from the MEOL structure after the second etching process.

In some embodiments, forming the MEOL structure comprises forming a first MEOL layer and a second MEOL layer which are made of different materials, such that the first MEOL layer has different density from that of the second MEOL layer.

In some embodiments, forming the MEOL structure comprises forming a first MEOL layer and a second MEOL layer which are made of the same material, wherein the first and second MEOL layers are formed by different recipes, such that the first MEOL layer has different density from that of the second MEOL layer.

In some embodiments, the method further comprises forming a filling layer within the trench after the second etching process.

According to various embodiments of the present disclosure, a semiconductor structure includes a semiconductor substrate, an ILD layer, an etch stop layer, and a MEOL structure. The ILD layer is on the semiconductor substrate. The etch stop layer is on the ILD layer. The MEOL structure is on the etch stop layer. The MEOL structure includes a bottom portion, a middle portion, and a top portion, and etch resistance of the MEOL structure varies from the bottom portion to the middle portion and varies from the middle portion to the top portion.

In some embodiments, the MEOL structure comprises a first material and a second material, and a ratio of the first material to the second material in the middle portion is different from those in the bottom and top portions.

In some embodiments, the bottom portion has different density from that of the middle portion.

In some embodiments, a semiconductor structure includes a semiconductor substrate, a gate structure, an etch stop layer, a dielectric structure, and a conductive material. The gate structure is on the semiconductor substrate. The etch stop layer is over the gate structure. The dielectric structure is over the etch stop layer, in which the dielectric structure has a ratio of silicon to nitrogen varying from a middle layer of the dielectric structure to a bottom layer of the dielectric structure. The conductive material extends through the dielectric structure.

In some embodiments, a semiconductor structure includes a semiconductor substrate, a gate structure, a dielectric layer, and a conductive material. The gate structure is on the semiconductor substrate. The dielectric layer is over the gate structure. The conductive material extends through the dielectric layer and over the gate structure. The conductive material has a width decreasing from a bottom level of the conductive material to a middle level of the conductive material and increasing from the middle level of the conductive material to the top level of the conductive material.

In some embodiments, a semiconductor structure includes a semiconductor substrate, a gate structure, an etch stop layer, a first dielectric layer, a second dielectric layer, a third dielectric layer, and a conductive material. The gate structure is on the semiconductor substrate. The etch stop layer is over the gate structure. The first dielectric layer is over the etch stop layer. The second dielectric layer is over the first dielectric layer, in which a density of the second dielectric layer is greater than a density of the first dielectric layer. The third dielectric layer is over the second dielectric layer, in which a density of the third dielectric layer is greater than a density of the second dielectric layer. The conductive material extends through the first, second, and third dielectric layers and above the gate structure.

In some embodiments, a method for forming a semiconductor structure includes forming a gate structure on a substrate; depositing a first dielectric layer over the gate structure; depositing a second dielectric layer over the first dielectric layer and having a different density than the first dielectric layer; performing a first etching process on the first and second dielectric layers to form a trench; performing a second etching process on the first and second dielectric layers to modify the trench; filling a conductive material in the modified trench. In some embodiments, the density of the second dielectric layer is less than a density of the first dielectric layer. In some embodiments, the density of the second dielectric layer is greater than a density of the first dielectric layer. In some embodiments, the method further includes depositing a third dielectric layer over the second dielectric layer and having a different density than the second dielectric layer, wherein the first and second etching processes are also performed on the third dielectric layer to form the trench. In some embodiments, the third dielectric layer has a greater density than the second dielectric layer. In some embodiments, the third dielectric layer has a greater density than the first dielectric layer. In some embodiments, depositing the first dielectric layer is performed by using a different precursor than depositing the second dielectric layer. In some embodiments, the second etching process is an anisotropic etching process. In some embodiments, the method further includes forming a patterned masking layer over the second dielectric layer prior to performing the first etching process, wherein the first and second etching processes are performed using the patterned masking layer as an etch mask. In some embodiments, the method further includes removing the patterned masking layer after performing the second etching process.

In some embodiments, a method for forming a semiconductor structure includes forming a gate structure on a semiconductor substrate; depositing a first dielectric layer over the gate structure; depositing a second dielectric layer over the first dielectric layer, wherein the first dielectric layer has a first ratio of silicon to nitrogen, and the second dielectric layer has a second ratio of silicon to nitrogen different from the first ratio of silicon to nitrogen; performing a first etching process on the first and second dielectric layers to form a trench; performing a second etching process on the first and second dielectric layers to laterally enlarge the trench; filling a conductive material in the enlarged trench. In some embodiments, the second ratio of silicon to nitrogen of the second dielectric layer is less than the first ratio of silicon to nitrogen of the first dielectric layer. In some embodiments, the second ratio of silicon to nitrogen of the second dielectric layer is greater than the first ratio of silicon to nitrogen of the first dielectric layer. In some embodiments, the method further includes depositing a third dielectric layer over the second dielectric layer and having a different ratio of silicon to nitrogen than the second dielectric layer. In some embodiments, the second etching is an ion etching process performed by using ions to strike the first and second dielectric layers through the trench at an angle of incidence relative to a vector normal to the substrate, and the angle is in a range from about −60° to about 60°. In some embodiments, depositing the first dielectric layer is performed by using trisilylamine as a first precursor, and depositing the second dielectric layer is performed by using tris(dimethylamino)silane as a second precursor.

In some embodiments, a semiconductor structure includes a semiconductor substrate, a first gate stack, an etch stop layer, a first dielectric layer, a second dielectric layer, and a filling layer. The first gate stack is on the semiconductor substrate. The etch stop layer is over the first gate stack. The first dielectric layer is over the etch stop layer. The second dielectric layer is over the first dielectric layer and has a different material than the first dielectric layer. The filling layer extends through the first and second dielectric layers and the etch stop layer and is on the first gate stack. The filling layer has an inverted-trapezoid shape from a cross-sectional view. In some embodiments, the semiconductor structure further includes a third dielectric layer over the second dielectric layer and having a different material than the second dielectric layer, wherein the filling layer also extends through the third dielectric layer. In some embodiments, the semiconductor structure further includes a second gate stack on the semiconductor substrate, wherein the filling layer is also on the second gate stack. In some embodiments, the semiconductor structure further includes a third gate stack on the semiconductor substrate, wherein the filling layer has an upper portion overlapping the third gate stack.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor structure, comprising:
   forming a gate structure on a substrate;
   depositing a first dielectric layer over the gate structure;
   depositing a second dielectric layer over the first dielectric layer and having a different density than the first dielectric layer, wherein depositing the second dielectric layer is performed by using a different precursor than depositing the first dielectric layer;
   performing a first etching process on the first and second dielectric layers to form a trench;
   performing a second etching process on the first and second dielectric layers to modify the trench; and
   filling a conductive material in the modified trench.

2. The method of claim 1, wherein the density of the second dielectric layer is less than a density of the first dielectric layer.

3. The method of claim 1, wherein the density of the second dielectric layer is greater than a density of the first dielectric layer.

4. The method of claim 1, further comprising:
   depositing a third dielectric layer over the second dielectric layer and having a different density than the second dielectric layer, wherein the first and second etching processes are also performed on the third dielectric layer.

5. The method of claim 4, wherein the third dielectric layer has a greater density than the second dielectric layer.

6. The method of claim 4, wherein the third dielectric layer has a greater density than the first dielectric layer.

7. The method of claim 1, wherein the second etching process is an anisotropic etching process.

8. The method of claim 1, further comprising:
forming a patterned masking layer over the second dielectric layer prior to performing the first etching process, wherein the first and second etching processes are performed using the patterned masking layer as an etch mask.

9. The method of claim 8, further comprising:
removing the patterned masking layer after performing the second etching process.

10. The method of claim 4, wherein depositing the second dielectric layer is performed by using a different precursor than depositing the third dielectric layer.

11. A method for forming a semiconductor structure, comprising:
forming a gate structure on a semiconductor substrate;
depositing a first dielectric layer over the gate structure;
depositing a second dielectric layer over the first dielectric layer, wherein the first dielectric layer has a first ratio of silicon to nitrogen, and the second dielectric layer has a second ratio of silicon to nitrogen different from the first ratio of silicon to nitrogen;
performing a first etching process on the first and second dielectric layers to form a trench;
performing a second etching process on the first and second dielectric layers to laterally enlarge the trench; and
filling a conductive material in the enlarged trench.

12. The method of claim 11, wherein the second ratio of silicon to nitrogen of the second dielectric layer is less than the first ratio of silicon to nitrogen of the first dielectric layer.

13. The method of claim 11, wherein the second ratio of silicon to nitrogen of the second dielectric layer is greater than the first ratio of silicon to nitrogen of the first dielectric layer.

14. The method of claim 11, further comprising:
depositing a third dielectric layer over the second dielectric layer and having a different ratio of silicon to nitrogen than the second dielectric layer.

15. The method of claim 11, wherein the second etching process is an ion etching process performed by using ions to strike the first and second dielectric layers through the trench at an angle of incidence relative to a vector normal to the substrate, and the angle is in a range from about −60° to about 60°.

16. The method of claim 11, wherein depositing the first dielectric layer is performed by using trisilylamine as a first precursor, and depositing the second dielectric layer is performed by using tris(dimethylamino)silane as a second precursor.

17. A semiconductor structure, comprising:
a semiconductor substrate;
a first gate stack on the semiconductor substrate;
an etch stop layer over the first gate stack;
a first dielectric layer over the etch stop layer;
a second dielectric layer over the first dielectric layer and having a different material than the first dielectric layer; and
a filling layer extending through the first and second dielectric layers and the etch stop layer and on the first gate stack, wherein the filling layer has an inverted-trapezoid shape from a cross-sectional view.

18. The semiconductor structure of claim 17, further comprising a third dielectric layer over the second dielectric layer and having a different material than the second dielectric layer, wherein the filling layer also extends through the third dielectric layer.

19. The semiconductor structure of claim 17, further comprising a second gate stack on the semiconductor substrate, wherein the filling layer is also on the second gate stack.

20. The semiconductor structure of claim 19, further comprising a third gate stack on the semiconductor substrate, wherein the filling layer has an upper portion overlapping the third gate stack.

* * * * *